US009200372B2

(12) United States Patent
Wojtczak et al.

(10) Patent No.: US 9,200,372 B2
(45) Date of Patent: Dec. 1, 2015

(54) PASSIVATION COMPOSITION AND PROCESS

(71) Applicant: Fujifilm Electronic Materials U.S.A., Inc., North Kingstown, RI (US)

(72) Inventors: William A. Wojtczak, Austin, TX (US); Bing Du, Gilbert, AZ (US); Tomonori Takahashi, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 189 days.

(21) Appl. No.: 13/657,367

(22) Filed: Oct. 22, 2012

(65) Prior Publication Data
US 2013/0122701 A1 May 16, 2013

Related U.S. Application Data

(60) Provisional application No. 61/550,041, filed on Oct. 21, 2011.

(51) Int. Cl.
| C23F 1/14 | (2006.01) |
| H01L 21/02 | (2006.01) |
| C23F 1/44 | (2006.01) |
| H01L 21/321 | (2006.01) |
| H01L 21/3213 | (2006.01) |
| C23C 22/48 | (2006.01) |
| C23F 1/16 | (2006.01) |
| H01L 21/285 | (2006.01) |

(52) U.S. Cl.
CPC . *C23F 1/44* (2013.01); *C23C 22/48* (2013.01); *C23F 1/16* (2013.01); *H01L 21/02* (2013.01); *H01L 21/321* (2013.01); *H01L 21/32134* (2013.01); *H01L 21/28518* (2013.01)

(58) Field of Classification Search
USPC .................................. 438/663, 753, 754
See application file for complete search history.

(56) References Cited

U.S. PATENT DOCUMENTS

| 4,271,965 A | 6/1981 | Brambley et al. |
| 4,285,761 A | 8/1981 | Fatula, Jr. et al. |
| 4,632,727 A | 12/1986 | Nelson |
| 4,804,438 A | 2/1989 | Rhodes |
| 4,944,851 A | 7/1990 | Cordani et al. |
| 5,232,563 A | 8/1993 | Warfield |
| 5,326,724 A | 7/1994 | Wei |
| 5,514,293 A | 5/1996 | Shimakura et al. |
| 5,591,354 A | 1/1997 | Patel et al. |
| 5,755,950 A | 5/1998 | Bell |

(Continued)

FOREIGN PATENT DOCUMENTS

| CN | 102290325 | 12/2011 |
| DE | 4100839 | 7/1992 |

(Continued)

OTHER PUBLICATIONS

International Search Report and Written Opinion issued in International Application No. PCT/US12/61355 on Dec. 27, 2012.

(Continued)

*Primary Examiner* — Joseph D Anthony
(74) *Attorney, Agent, or Firm* — Fish & Richardson P.C.

(57) ABSTRACT

This disclosure relates to a passivation composition containing at least one sulfonic acid, at least one compound containing a nitrate or nitrosyl ion, and water. The passivation composition is substantially free of a halide ion.

25 Claims, 1 Drawing Sheet

(56) References Cited

U.S. PATENT DOCUMENTS

| | | | |
|---|---|---|---|
| 5,977,581 A | 11/1999 | Thakur et al. | |
| 6,221,746 B1 | 4/2001 | Huang et al. | |
| 6,407,047 B1 | 6/2002 | Mehta et al. | |
| 6,494,960 B1 | 12/2002 | Macdonald et al. | |
| 6,630,433 B2 | 10/2003 | Zhang et al. | |
| 6,703,291 B1 | 3/2004 | Boyanov et al. | |
| 7,235,188 B2 * | 6/2007 | Daviot et al. | 252/79.1 |
| 7,238,291 B2 | 7/2007 | Onsia et al. | |
| 7,268,430 B2 | 9/2007 | Suga et al. | |
| 7,344,978 B2 | 3/2008 | Chang et al. | |
| 7,517,765 B2 | 4/2009 | Brunco et al. | |
| 7,790,624 B2 | 9/2010 | Sharma | |
| 7,951,653 B1 | 5/2011 | Park et al. | |
| 8,647,523 B2 * | 2/2014 | Takahashi et al. | 216/83 |
| 8,709,277 B2 * | 4/2014 | Takahashi et al. | 252/79.1 |
| 2001/0054706 A1 | 12/2001 | Levert et al. | |
| 2003/0198889 A1 | 10/2003 | Iwasa et al. | |
| 2004/0010112 A1 * | 1/2004 | Srinivasan et al. | 528/176 |
| 2004/0099637 A1 | 5/2004 | Johnson et al. | |
| 2004/0169013 A1 | 9/2004 | Kool et al. | |
| 2005/0050803 A1 | 3/2005 | Amanokura et al. | |
| 2005/0070098 A1 | 3/2005 | Bruley et al. | |
| 2005/0178742 A1 | 8/2005 | Chelle et al. | |
| 2006/0051961 A1 | 3/2006 | Cabral, Jr. et al. | |
| 2006/0201360 A1 | 9/2006 | Andriessen et al. | |
| 2006/0226122 A1 | 10/2006 | Wojtczak et al. | |
| 2007/0009449 A1 | 1/2007 | Kanca | |
| 2007/0015360 A1 | 1/2007 | Lu et al. | |
| 2007/0020925 A1 | 1/2007 | Hsieh et al. | |
| 2007/0111356 A1 | 5/2007 | Wilson et al. | |
| 2007/0135661 A1 * | 6/2007 | Kishan et al. | 568/717 |
| 2007/0161246 A1 | 7/2007 | Obeng et al. | |
| 2008/0045035 A1 | 2/2008 | Lee et al. | |
| 2008/0073614 A1 | 3/2008 | Akiyama et al. | |
| 2008/0116170 A1 | 5/2008 | Collins et al. | |
| 2008/0210900 A1 | 9/2008 | Wojtczak et al. | |
| 2008/0224232 A1 | 9/2008 | Hsieh et al. | |
| 2008/0274611 A1 | 11/2008 | Cabral et al. | |
| 2009/0212021 A1 | 8/2009 | Bernhard et al. | |
| 2009/0261291 A1 | 10/2009 | Banerjee et al. | |
| 2009/0280641 A1 | 11/2009 | Kang et al. | |
| 2009/0309228 A1 | 12/2009 | Fang et al. | |
| 2010/0079924 A1 | 4/2010 | Keating et al. | |
| 2010/0089872 A1 | 4/2010 | Ihara et al. | |
| 2010/0261632 A1 | 10/2010 | Korzenski et al. | |
| 2011/0146724 A1 | 6/2011 | Lee | |
| 2012/0091100 A1 | 4/2012 | Bedell et al. | |
| 2012/0231632 A1 * | 9/2012 | Takahashi et al. | 438/754 |
| 2014/0141622 A1 * | 5/2014 | Peters et al. | 438/754 |

FOREIGN PATENT DOCUMENTS

| | | | | |
|---|---|---|---|---|
| DE | 100 39 684 | 5/2001 | | C23F 1/28 |
| DE | 102009045114 | 3/2011 | | |
| KR | 2003-0004861 | 1/2003 | | C23C 18/16 |
| TW | 1293988 | 7/1994 | | |
| WO | WO2012017819 | 2/2012 | | |
| WO | WO2012097143 | 7/2012 | | |

OTHER PUBLICATIONS

International Search Report and Written Opinion issued in International Application No. PCT/US2013/052863 dated Jan. 17, 2014 (13 pages).

International Search Report and the Written Opinion issued in International Application No. PCT/US12/28249 on Aug. 16, 2012.

* cited by examiner

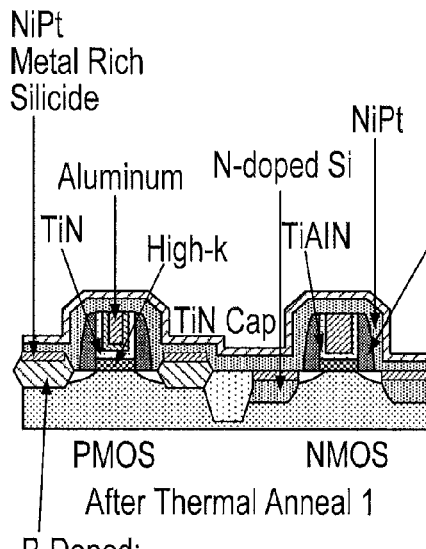
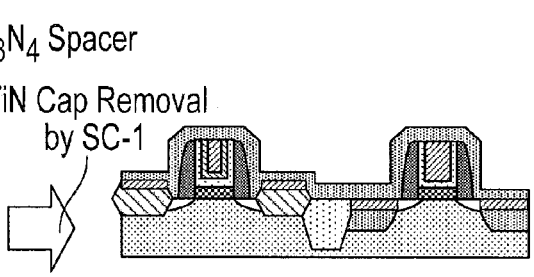
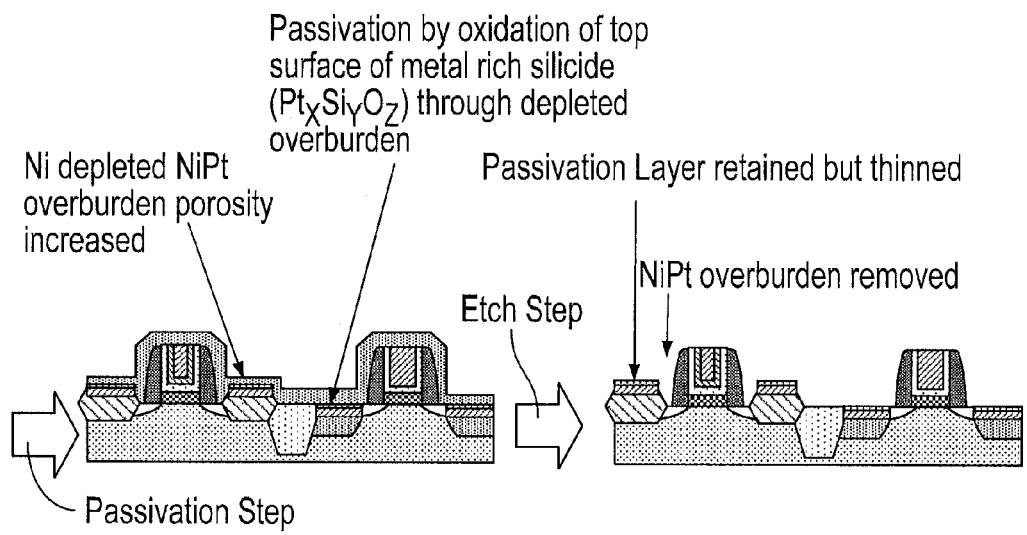
FIG. 1A  FIG. 1B  FIG. 1C  FIG. 1D

PASSIVATION COMPOSITION AND PROCESS

CROSS-REFERENCE TO RELATED APPLICATION

The present application claims priority to U.S. Provisional Application No. 61/550,041, filed on Oct. 21, 2011, the contents of which are hereby incorporated by reference in their entirety.

FIELD OF THE DISCLOSURE

The present disclosure relates to semiconductor device manufacturing, and particularly to selective metal wet etching compositions and processes for selectively etching certain metals relative to adjacent structures and materials with those etching compositions. More particularly, the present disclosure relates to aqueous metal passivation and etching compositions, as well as processes of using these compositions in the presence of one or more of aluminum, and nickel platinum silicides.

BACKGROUND TO THE DISCLOSURE

Integrated circuit manufacture is a multi-step construction process. The process entails repetitive steps of lithography to selectively expose underlying layers, etching of partially or completely exposed layers, and deposition of layers or filling of gaps frequently produced by etching or selective deposition of materials. Etching of metals is a critical process step. Frequently metals must be selectively etched in the presence of other metals, metal alloys, and/or non metal materials without corroding, etching, or oxidizing the adjacent materials. As the dimensions of the features in the integrated circuit become increasingly smaller, the importance of minimizing corrosion, etching, oxidizing, or other damage to adjacent materials and features increases.

The structural features and compositions of the other metals, metal alloys, and non metal materials may vary depending on the particular device so that prior art compositions may not etch the specific metal without damaging the materials in adjacent structures. Combinations of particular adjacent materials may also affect the type and amount of damage produced in an etching step. Thus, it is often not obvious which etch composition is appropriate for a given device structure and adjacent materials.

A particular problem is the etching of NiPt over a NiPt silicide layer in the presence of other metals. The use of aqua regia based etching or other known NiPt chemistry successfully etches the NiPt but typically damages or oxidizes other metals. When using aqua regia based chemistry, the etch selectivity of the NiPt relative to the NiPt silicide is unsatisfactory and typically results in a silicide surface deficient in nickel and platinum species (e.g. Pt or $PtO_x$) and also an unsatisfactorily high level of silicon oxides deep into the film. $PtO_x$ species appear to etch slower in aqua regia type etchants. Compositions employed in a process providing a surface enriched in $PtO_x$ species may help protect the underlying NiPt silicide from excessive oxidation and etching.

It is an objective of this disclosure to provide compositions and processes which are suitable to etch NiPt in the presence of NiPt silicides with greater selectivity, with decreased silicon oxidation and, without significant damage to other metals typically employed in semiconductor fabrication.

SUMMARY OF THE DISCLOSURE

In one aspect, this disclosure features a passivation composition comprising at least one compound containing a nitrate or nitrosyl ion, b) at least one sulfonic acid, and c) water.

In another aspect, this disclosure features a composition (e.g., a composition for passivating a NiPt or NiPt silicide layer) that includes at least one sulfonic acid; at least one compound containing a nitrate or nitrosyl ion; and water. The composition is substantially free of a halide ion. In some embodiments, the composition consists essentially of the at least one sulfonic acid, the at least one compound containing a nitrate or nitrosyl ion; and the water.

In another aspect, this disclosure features a composition (e.g., a passivation composition) that includes from about 55% to about 75% of at least one sulfonic acid; at least one compound containing a nitrate or nitrosyl ion; and water. The composition contains from about 0.1% to about 20% of the nitrate or nitrosyl ion and is substantially free of a halide ion. In some embodiments, the composition consists essentially of the at least one sulfonic acid, the at least one compound containing a nitrate or nitrosyl ion; and the water.

In another aspect, this disclosure features a composition (e.g., a passivation composition) that includes a first sulfonic acid of formula (1):

$$R^1SO_3H \qquad (1),$$

in which $R^1$ is unsubstituted $C_1$-$C_4$ straight or branched alkyl; a second sulfonic acid of formula (2):

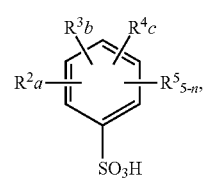

(2)

in which each of $R^2$, $R^3$, and $R^4$, independently, is $C_1$-$C_{12}$ straight or branched alkyl, $C_3$-$C_{12}$ cyclic alkyl, F, Cl, or Br; $R^5$ is H; and each of a, b, c, and n, independently, is 0, 1, 2, or 3 provided that the sum of a, b, and c is n; at least one compound containing a nitrate or nitrosyl ion; and water. The composition is substantially free of a halide ion. In some embodiments, the composition consists essentially of the first and second sulfonic acids, the at least one compound containing a nitrate or nitrosyl ion; and the water.

In another aspect, this disclosure features a method that includes (1) annealing a NiPt film disposed on a silicon film, the silicon film being disposed between the NiPt film and a semiconductor substrate; (2) treating the annealed NiPt film with a passivation composition, the passivation composition containing at least one compound containing a nitrate or nitrosyl ion, at least one sulfonic acid, and water, and the passivation composition being substantially free of a halide ion; (3) removing the passivation composition from the treated NiPt film; (4) treating the resulting NiPt film with an etching composition to remove the NiPt film, the etching composition containing at least one sulfonic acid, at least one compound containing a halide anion in which the halide anion is chloride or bromide, at least one compound containing a nitrate or nitrosyl ion, and water; and (5) removing the etching composition.

In some embodiments, this disclosure features a passivation and etch process which includes a) providing a semiconductor substrate containing on its top surface a film resulting from the annealing of a NiPt film over a silicon film, b) treating the annealed NiPt film with a passivation composition containing at least one compound containing a nitrate or nitrosyl ion, at least one sulfonic acid, and water.

In some embodiments, this disclosure features a passivation and etch process which comprises a) providing a semiconductor substrate containing on its top surface a film resulting from the annealing of a NiPt film over a silicon film, b) treating the annealed NiPt film with a passivation composition containing at least one compound containing a nitrate or nitrosyl ion, at least one sulfonic acid, and water; c) removing the passivation composition from the treated NiPt film, d) treating the resulting NiPt film with a composition for etching NiPt that contains at least one sulfonic acid; at least one compound containing a halide anion, the halide being chloride or bromide; at least one compound containing a nitrate or nitrosyl ion; and water, and e) removing the composition for etching NiPt.

BRIEF DESCRIPTION OF DRAWINGS

FIGS. 1A-1D illustrate a process of uncovering, passivating, and etching a NiPt film over a NiPt silicide film on a semiconductor substrate using the compositions described in this disclosure. FIG. 1A illustrates an exemplary semiconductor device containing a semiconductor substrate that is coated with a NiPt layer and a TiN cap, and then treated with a thermal annealing process. FIG. 1B illustrates a semiconductor device obtained by removing the TiN cap from the semiconductor device in FIG. 1A. FIG. 10 illustrates a semiconductor device obtained by treating the semiconductor device in FIG. 1B with a passivation composition described in this disclosure. FIG. 1D illustrates a semiconductor device obtained by treating the semiconductor device in FIG. 1C with an etching composition described in this disclosure to remove residual NiPt.

DETAILED DESCRIPTION OF THE DISCLOSURE

The following terms, as used in the context of this disclosure, are defined below.

The numerical limits (i.e., the upper and lower limits) of the ranges and ratios described herein can be combined. The ranges described herein include all intermediate values within the ranges. In other words, all intermediate values within the ranges described herein are deemed to be disclosed by the disclosure of the ranges. All possible combinations of the various disclosed elements are deemed to be included within the scope of the present disclosure unless specifically excluded.

The term "passivation" is employed to mean the reduction of reactivity of a chemically active metal surface. In the context of this disclosure, the passivation is believed to be occurring by oxidation of various species.

The term "NiPt overburden" is employed to mean the residual layer of NiPt atop a NiPt silicide layer. The NiPt silicide layer can be formed between a NiPt layer and a silicon layer by annealing, which results in diffusion of silicon in the silicon layer into the NiPt layer, and diffusion of Ni and Pt in the NiPt layer into the silicon layer.

The terms "layer" and "film" are used interchangeably. Patterned wafers are to be considered semiconductor substrates.

Unless otherwise stated, % is weight %. All temperatures are measured in Celsius degrees, unless otherwise stated.

The term "essentially free" in the context of this disclosure is defined to mean that none of the specified compounds is intentionally added to a formulation. The specified compounds, if present, are only contaminants in negligible amounts that would not materially affect the properties of a formulation.

To remove residual platinum and nickel after a NiPt silicide is formed, NiPt etch chemistry is applied to the surface that selectively removes the NiPt metal overburden, which could lead to an inoperable semiconductor device if left on the NiPt silicide layer. The chemical selectivity of NiPt etch to metal rich NiPt silicide, aluminum, titanium nitride, tungsten, silicon nitride and silicon dioxide is a critical process parameter. Aqua regia based chemistries typically offer excellent NiPt etch capability but have low selectivity to the metal rich silicide and disadvantageously oxidize the NiPt silicide.

Without wishing to be bound by theory, it is believed that the nitrate source, when reacting with the halide source in a strongly acidic environment, forms an oxidizing NO (nitrosyl) halide intermediate. The nitrosyl cation in the intermediate can oxidize metals (e.g., Ni and Pt) on a semiconductor substrate, and the free halide anion in the intermediate can complex the oxidized metal ions and assist in their dissolution in the aqueous etching composition. The soluble metal salts are believed to be coordination compounds containing halide anions in the coordination sphere. The water is believed to solubilize the inorganic metal salts.

In co-pending U.S. patent application Ser. No. 13/415,390, lower oxidation of the NiPt silicide layer can be obtained by employing low concentrations of halide ion using aqueous sulfonic acids as a solvent. Without wishing to be bound by theory, it is believed that sulfonic acids maintain a low pH for effective formation of the nitrosyl halide at low concentrations of halide and nitrate, and for assistance in dissolution of the metal salts. However, some oxidation still occurs and a decrease in the amount of oxidation is still desired. In addition, the oxidative characteristics of different materials can be different, presenting difficulties in obtaining concurrent decreases in oxidation without unacceptably low NiPt etch rates in all situations.

To further reduce undesired NiPt silicide oxidation, it is believed that treating NiPt/NiPt silicide layers (or other metal silicide layers) with an etching composition that is free of a halide ion before the primary aqua regia etching step passivates the NiPt/NiPt silicide layers (or other metal silicide layers). Without wishing to be bound by theory, it is believed that this passivation treatment reduces damages to the NiPt silicide (or other metal silicides) surfaces caused by the subsequent etching process, and results in a NiPt silicide (or other metal silicides) surface layer containing higher levels of Pt species and lower levels of oxidized silicon after removing the NiPt layer by etching.

In general, the passivation composition contains a) at least one compound containing a nitrate or nitrosyl ion, b) at least one sulfonic acid, and c) water.

In some embodiments, the passivation composition is substantially free of any ingredient other than the least one compound containing a nitrate or nitrosyl ion, at least one sulfonic acid, and water. For example, the passivation composition can contain about 1% or less of any ingredient other than the least one compound containing a nitrate or nitrosyl ion, at least one sulfonic acid, and water.

In general, the passivation composition is substantially free of a halide ion (i.e., F⁻, Cl⁻, Br⁻, or I⁻). For example, the passivation composition can contain about 1 ppm or less of a halide ion.

In some embodiments, the passivation composition is substantially free of one or more of the compounds selected from the group consisting of sulfuric acid, phosphorus acids, abrasives, surfactants, carboxylic acids, hydrogen peroxide, oxidized metal ions, azole compounds, metal halides, complex metal halides, cerium bases oxidizing agents, and silver salts.

Any suitable source of ionic nitrate anions or nitrosyl salts may be employed in the passivation composition of this disclosure. Suitable ionic nitrate sources include, but are not limited to, nitric acid, ammonium nitrate, quaternary ammonium nitrates, substituted ammonium nitrates, nitrogen based aromatic and pseudoaromatic reaction products with nitric acid, phosphonium nitrates, and metal nitrates.

In some embodiments, preferred sources of ionic nitrate and nitrosyl salts include, but are not limited to, nitric acid, ammonium nitrate, quaternary ammonium nitrates, nitrogen based aromatic and pseudoaromatic reaction products with nitric acid. More preferred sources of ionic nitrate and nitrosyl salts include, but are not limited to, nitric acid, ammonium nitrate, and quaternary ammonium nitrates. The most preferred sources of ionic nitrate are nitric acid and ammonium nitrate.

Specific examples of quaternary ammonium nitrates include, but are not limited to, tetramethylammonium nitrate, ethyltrimethylammonium nitrate, diethyldimethyl ammonium nitrate, methyltriethylammonium nitrate, tetraethylammonium nitrate, phenyltrimethyl ammonium nitrate, dimethyldiphenylammonium nitrate, benzyl trimethylammonium nitrate, tetrapropylammonium nitrate, tetrabutylammonium nitrate, dimethyldibutylammonium nitrate, decyltrimethylammonium nitrate, pentyltrimethylammonium nitrate, tetraisopropylammonium nitrate, decyltrimethylammonium nitrate, 2,2,2-trifluoroethyltrimethylammonium nitrate, fluorophenyl trimethyl ammonium nitrate, chlorophenyltrimethylammonium nitrate, and methylphenyltrimethylammonium nitrate. Tetramethylammonium nitrate, tetraethylammonium nitrate, methyltriethylammonium nitrate, ethyltrimethylammonium nitrate are preferred from this class of nitrates.

Examples of substituted ammonium nitrates include, but are not limited to, the reaction products of nitric acid with mono-, di-, and trisubstituted amine compounds, which contain one or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic reaction products with nitric acid, include, but are not limited to, the reaction products of nitric acid with pyridine, pyrole, pyrazole, imidazole, pyrazine, pyrimidine, and their substituted derivatives.

Examples of phosphonium nitrates include tetramethylphosphonium nitrate, tetraethylphosphonium nitrate, tetrapropylphosphonium nitrate, tetrabutylphosphonium nitrate, dimethyldiethylphosphonium nitrate, phenyltrimethylphosphonium nitrate, and fluorophenyltrimethylphosphonium nitrate.

Examples of metal nitrates include sodium nitrate, lithium nitrate, copper nitrates, iron nitrates, magnesium nitrate, nickel nitrate, palladium nitrate, platinum nitrate, and tin nitrate.

Suitable nitrosyl salts include nitrosyl chloride, nitrosyl bromide, nitrosyl fluoride, nitrosyl tetrafluoroborate, and nitrosyl hydrogen sulfate. Nitrosyl hydrogen sulfate and nitrosyl tetrafluoroborate are preferred. Nitrosyl hydrogen sulfate is more preferred.

In some embodiments, the passivation composition can include at least about 0.1% (e.g., at least about 0.5%, at least about 1%, at least about 2%, or at least about 2.5%) and/or at most about 20% (e.g., at most about 15%, at most about 10%, at most about 9.5%, at most about 5%, or at most about 2.5%) of the nitrate or nitrosyl ion. For example, suitable weight ranges of the nitrate or nitrosyl ion in the passivation composition include from about 0.5% to about 10%, from about 0.5% to about 5%, from about 0.5% to about 2.5%, and from about 2.5% to about 9.5%.

In some embodiments, the preferred at least one compound containing a nitrate or nitrosyl ion is nitric acid, or ammonium nitrate. In some embodiments, the preferred at least one compound containing a nitrate or nitrosyl ion is nitric acid.

In general, the passivation composition further includes at least one sulfonic acid. The sulfonic acids suitable for the passivation composition can be a solid or a liquid at room temperature as long as the sulfonic acid is water soluble and the final composition is a homogeneous liquid. Liquid or low melting solid sulfonic acids can work effectively.

In some embodiments, the sulfonic acids are described by $R^1SO_3H$ (Formula (1)) or by Formula (2) below, or are a naphthalenesulfonic acid that is optionally substituted with a $C_1$-$C_{12}$ straight or branched alkyl group or $SO_3H$.

In Formula (1), $R^1$ can be substituted or unsubstituted $C_1$-$C_{12}$ straight, or branched alkyl, substituted or unsubstituted $C_3$-$C_{12}$ cyclic alkyl, $C_1$-$C_{12}$ straight or branched perfluoroalkyl, $C_3$-$C_{12}$ cyclic perfluoroalkyl, $C_1$-$C_{12}$ straight or branched fluoroalkyl ether, $C_3$-$C_{12}$ cyclic fluoroalkyl ether, or substituted or unsubstituted $C_7$-$C_{12}$ alicyclic. Examples of substituents include $C_1$-$C_4$ alkyl groups, sulfonic acid groups, phenyl groups, $C_1$-$C_4$ alkylphenyl groups, hydroxyphenyl groups, and halogen (e.g., fluorine). In Formula (2), $R^2$, $R^3$, and $R^4$ are independently selected from the group consisting of $C_1$-$C_{12}$ straight or branched alkyl, $C_3$-$C_{12}$ cyclic alkyl, Cl, Br, F, OH, $NO_2$, $SO_3H$, and $CO_2H$; $R^5$=H; and a, b, c, and n are integers selected from the group consisting of 0, 1, 2, and 3 with the relationship a+b+c=n.

Formula (2)

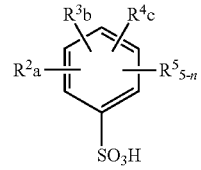

In some embodiments, preferred sulfonic acids of Formula (1) are those wherein $R^1$ is substituted or unsubstituted $C_1$-$C_4$ straight, or branched alkyl, $C_1$-$C_4$ straight or branched perfluoroalkyl, $C_4$-$C_6$ straight or branched fluoroalkyl ether, and substituted or unsubstituted $C_7$-$C_{10}$ alicyclic groups.

In some embodiments, more preferred sulfonic acids of Formula (1) are those wherein $R^1$ is substituted or unsubstituted $C_1$-$C_4$ straight or branched alkyl or $C_1$-$C_4$ straight or branched perfluoroalkyl.

In some embodiments, the most preferred sulfonic acids of Formula (1) are those wherein $R^1$ is substituted or unsubstituted $C_1$-$C_2$ alkyl or $C_1$-$C_2$ perfluoroalkyl.

In some embodiments, preferred sulfonic acids of Formula (2) are those wherein $R^2$, $R^3$, and $R^4$ are $C_1$-$C_4$ straight or branched alkyl, $C_1$, $NO_2$, OH, $SO_3H$, F, and $CO_2H$, where n is an integer selected from the group consisting of 0, 1 and 2.

In some embodiments, more preferred sulfonic acids of Formula (2) are those wherein $R^2$, $R^3$, and $R^4$ are $C_1$-$C_4$ straight or branched alkyl, $C_1$, $NO_2$, OH, $SO_3H$, F, and $CO_2H$, where n is an integer selected from the group consisting of 0 and 1.

In some embodiments, the most preferred sulfonic acids of Formula (2) are those wherein $R^2$, $R^3$, and $R^4$ are $C_1$-$C_2$ alkyl, $C_1$, $NO_2$, OH, F, and $CO_2H$, where n is an integer selected from the group consisting of 0 and 1.

Examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, perfluoro(ethoxyethane) sulfonic acid, perfluoro(methoxyethane)sulfonic acid, dodecylsulfonic acid, perfluorododecylsulfonic acid, butanesulfonic acid, perfluorobutanesulfonic acid, propanesulfonic acid, perfluoropropanesulfonic acid, octylsulfonic acid, pefluorooctanesulfonic acid, methanedisulfonic acid, 2-methylpropanesulfonic acid, cyclohexylsulfonic acid, camphorsulfonic acids, perfluorohexanesulfonic acid, ethanedisulfonic acid, benzylsulfonic acid, hydroxyphenylmethanesulfonic acid, naphthylmethanesulfonic acid, and norbornanesulfonic acids.

In some embodiments, preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, butanesulfonic acid, perfluorobutanesulfonic acid, propanesulfonic acid, perfluoropropanesulfonic acid, methanedisulfonic acid, 2-methylpropanesulfonic acid, camphorsulfonic acids, ethanedisulfonic acid, benzylsulfonic acid, hydroxyphenylmethanesulfonic acid, naphthylmethanesulfonic acid, and norbornanesulfonic acids.

In some embodiments, more preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, butanesulfonic acid, perfluorobutanesulfonic acid, propanesulfonic acid, perfluoropropanesulfonic acid, methanedisulfonic acid, 2-methylpropanesulfonic acid, ethanedisulfonic acid, benzylsulfonic acid, hydroxyphenylmethanesulfonic acid, and naphthylmethanesulfonic acid.

In some embodiments, the most preferred examples of sulfonic acids of Formula (1) include, but are not limited to, methanesulfonic acid, trifluoromethanesulfonic acid, ethanesulfonic acid, trifluoroethanesulfonic acid, perfluoroethylsulfonic acid, methanedisulfonic acid, and ethanedisulfonic acid.

Examples of sulfonic acids of Formula (2) include, but are not limited to, benzenesulfonic acid, chlorobenzenesulfonic acids, bromobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids (e.g., p-toluenesulfonic acid), methylchlorobenzenesulfonic acids, dodecylbenzenesulfonic acids, butylbenzenesulfonic acids, cyclohexylbenzenesulfonic acids, picrylsulfonic acid, dichlorobenzenesulfonic acids, dibromobenzenesulfonic acids, and 2,4,5-trichlorobenzenesulfonic acid.

In some embodiments, preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids (e.g., p-toluenesulfonic acid), methylchlorobenzenesulfonic acids, butylbenzenesulfonic acids, and dichlorobenzenesulfonic acids.

In some embodiments, more preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, benzenedisulfonic acids, toluenesulfonic acids (e.g., p-toluenesulfonic acid), and butylbenzenesulfonic acids.

In some embodiments, more preferred examples of sulfonic acids of Formula (2) include, but are not limited to, benzenesulfonic acid, chlorobenzenesulfonic acids, fluorobenzenesulfonic acids, hydroxybenzenesulfonic acids, nitrobenzenesulfonic acids, and toluenesulfonic acids (e.g., p-toluenesulfonic acid).

In some embodiments, the at least one sulfonic acid is a naphthalenesulfonic acid, which is optionally substituted with a $C_1$-$C_{12}$ straight or branched alkyl group or $SO_3H$. Examples of substituted or unsubstituted naphthalenesulfonic acid include, but are not limited to, 1-naphthalenesulfonic acid, 2-naphthalenesulfonic acid, 8-methyl-1-naphthalenesulfonic acid, 5-methyl-2-naphthalenesulfonic acid, 3-methyl-2-naphthalenesulfonic acid, and 4-methyl-1-naphthalenesulfonic acid.

In some embodiments, the at least one sulfonic acid is an anthracenesulfonic acid, which is optionally substituted with a $C_1$-$C_{12}$ linear or branched alkyl group or $SO_3H$. Examples of substituted or unsubstituted anthracenesulfonic acid include, but are not limited to, 1-anthracenesulfonic acid, 2-anthracenesulfonic acid, 9-anthracenesulfonic acid, and 9,10-anthracenedisulfonic acid.

In some embodiments, the at least one sulfonic acid in the passivation composition described herein includes a mixture of one or more of a first sulfonic acid and one or more of a second sulfonic acid having higher hydrophobicity than the at least one first sulfonic acid. The first sulfonic acid can be selected from the group consisting of acids of Formula (1): $R^1SO_3H$, where $R^1$ is an unsubstituted $C_1$-$C_4$ straight or branched alkyl.

The second sulfonic acid can be selected from the group consisting of sulfonic acids of formula (2):

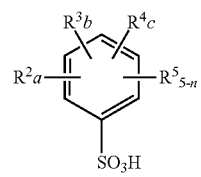

Formula (2)

In Formula (2), $R^2$, $R^3$, and $R^4$ are independently selected from the group consisting of $C_1$-$C_{12}$ straight or branched alkyl, $C_3$-$C_{12}$ cyclic alkyl, Cl, Br, F; $R^5$ is H; and a, b, c, and n are integers selected from the group consisting of 0, 1, 2, and 3 with the relationship a+b+c=n.

The second sulfonic acid can also be a compound of Formula (1): $R^1SO_3H$, where $R^1$ is substituted or unsubstituted $C_6$-$C_{12}$ straight or branched alkyl, substituted or unsubstituted $C_6$-$C_{12}$ cyclic alkyl, $C_1$-$C_{12}$ straight or branched perfluoroalkyl, $C_3$-$C_{12}$ cyclic perfluoroalkyl, $C_1$-$C_{12}$ straight or branched fluoroalkyl ether, $C_3$-$C_{12}$ cyclic fluoroalkyl ether, or substituted or unsubstituted $C_7$-$C_{12}$ alicyclic groups. Examples of substituents include, but are not limited to, $C_1$-$C_4$ alkyl groups, phenyl groups, and fluorine atoms. Hydrophilic groups (e.g., OH, COOH, $SO_3H$, or $NO_2$) are excluded from substituents suitable for the second sulfonic acid.

Examples of the first sulfonic acids of Formula (1) include, but are not limited to, methanesulfonic acid, ethanesulfonic acid, propanesulfonic acid, and butanesulfonic acid.

Examples of the second sulfonic acids of Formula (2) include, but are not limited to, benzenesulfonic acid, chlorobenzenesulfonic acids, bromobenzenesulfonic acids, fluorobenzenesulfonic acids, toluenesulfonic acids (e.g., p-toluenesulfonic acid), methylchlorobenzenesulfonic acids, dodecylbenzenesulfonic acids, butylbenzenesulfonic acids, cyclohexylbenzenesulfonic acids, dichlorobenzenesulfonic acids, dibromobenzenesulfonic acids, and 2,4,5-trichlorobenzenesulfonic acid.

Other sulfonic acids suitable as the second sulfonic acid include, but are not limited to, trifluoromethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, perfluorobutanesulfonic acid, perfluoropropanesulfonic acid, octylsulfonic acid, pefluorooctanesulfonic acid, cyclohexylsulfonic acid, camphorsulfonic acids, perfluorohexanesulfonic acid, benzylsulfonic acid, naphthylmethanesulfonic acid, and norbornanesulfonic acid, Preferred sulfonic acids suitable as the second sulfonic acid are those of Formula (1) where $R^1$ is $C_1$-$C_{12}$ straight or branched perfluoroalkyl and those of Formula (2) where $R^2$ is $C_1$-$C_{12}$ straight or branched alkyl, a is 1, and b and c are 0.

In some embodiments, the at least one sulfonic acid is a mixture of one or more of the first sulfonic acid of Formula (1) described above and one or more of a second sulfonic acid in which the second sulfonic acid is a naphthalenesulfonic acid optionally substituted with a $C_1$-$C_{12}$ straight or branched alkyl group or $SO_3H$, or an anthracenesulfonic acid optionally substituted with a $C_1$-$C_{12}$ straight or branched alkyl group or $SO_3H$.

In some embodiments, the passivation composition includes the first sulfonic acid and the second sulfonic acid in a weight ratio of at least about 10:1 (e.g., at least about 20:1, or at least about 30:1) and/or at most about 150:1 (e.g., at most about 60:1, at most about 40:1, or at most about 20:1). In some embodiments, the first sulfonic acid and the second sulfonic acid are employed in a weight ratio of from about 10:1 to about 150:1. In some embodiments, the first sulfonic acid and the second sulfonic acid are employed in a weight ratio of from about 20:1 to about 60:1. In some embodiments, the first sulfonic acid and the second sulfonic acid are employed in a weight ratio of from about 30:1 to about 40:1. In some embodiments, the first sulfonic acid and the second sulfonic acid are employed in a weight ratio of from about 10:1 to about 20:1.

In some embodiments, the at least one sulfonic acid can be at least about 5% (e.g., at least about 10%, at least about 20%, at least about 30%, at least about 40%, at least about 50%, at least about 55%, at least about 60%, or at least about 65%) and/or at most about 90% (e.g., at most about 85%, at most about 80%, at most about 75%, or at most about 70%, or at most about 65%) of the passivation composition. For example, the concentration of the at least one sulfonic acid in the passivation composition can range from about 55% to about 90% (e.g., from about 55% to about 85%, from about 55% to about 80%, from about 55% to about 75%, from about 55% to about 70%, from about 60% to about 70%, or from about 59% to about 67%).

In general, the passivation composition includes water. The water is preferably deionized water. The water is typically the remainder of the passivation composition after the sulfonic acid, the nitrate source and any optional ingredients employed are added. In some embodiments, the water can be at least about 10% (e.g., at least about 20%, at least about 30%, at least about 40%, or at least about 50%) and/or at most about 80% (e.g., at most about 70%, or at most about 60%) of the passivation composition. For example, the water can be from about 20% to about 70% (e.g., from about 30% to about 70%, from about 40% to about 70%, or from about 50% to about 70%) of the passivation composition. In some embodiments, the water is from about 10% to about 60% (e.g., from about 20% to about 60%, from about 30% to about 60%, or from about 40% to about 60%) of the passivation composition. In some embodiments, the water is from about 20% to about 40% (e.g., from about 20% to about 35%, from about 25% to about 35%, or from about 25% to about 40%) of the passivation composition.

The pH of the passivation composition can be at most about 2 (e.g., at most about 1.5, at most about 1, or at most about 0) and/or at least about −5 (e.g., at least about −3, at least about −2, or at least about −1). A preferred pH is from about 1.5 to about −2. A more preferred pH is from about 1 to about −2. The most preferred pH is from about −2 to about 0.

Performance of the passivation composition described herein can be optimized for the specific metals present on the device being passivated, for example, by adjusting the combinations and concentrations of the components employed.

In some embodiments, the passivation composition contains A) about 55% to about 90% (e.g., about 55% to about 85%, about 55% to about 80%, about 55% to about 75%, about 55% to about 70%, about 60% to about 90%, about 60% to about 85%, about 60% to about 80%, about 60% to about 75%, or about 60% to about 70%) of at least one sulfonic acid (e.g., methane sulfonic acid and/or p-toluene sulfonic acid), B) about 0.1% to about 20% (e.g., about 0.5% to about 10%, about 1% to about 10%, about 1.5% to about 10%, about 2% to about 10%, about 2.5% to about 10%, or about 2.5% to about 9.5%) of at least one nitrate anion or a nitrosyl cation (e.g., nitrate), C) corresponding counter ions for the nitrate anions or nitrosyl cation, and D) about 10% to about 80% (e.g., about 10% to about 60%, about 10% to about 40%, about 10% to about 35%, about 20% to about 60%, about 20% to about 40%, about 20% to about 35%, about 25% to about 40%, or about 25 to about 35%) water. In some embodiments, the passivation composition consists essentially of ingredients A), B), C), and D) described above.

Optional additives that can be employed in the passivation composition described herein to optimize performance or lower cost include organic solvents, carboxylic acids or other complexing agents, viscosity reducing agents and surfactants. The surfactants not only can be used in their traditional purpose as surface tension modifiers, but also can be used as wetting agents to inhibit corrosion on various exposed surfaces, such as aluminum, silicon dioxide, silicon nitride, silicide, tungsten, and TiN. The solvents allow modification of the Hansen solubility parameters for the solution, which changes the oxidation potential of the solution. Both the same class and different types of additives can be employed in the passivation composition described herein. Care should be taken that the additives are stable under low pH conditions. Additives may be employed from 0% to about 20% of the passivation composition.

In general, this disclosure features a process for generation of a NiPt layer and removal of this layer during preparation of a NiPt silicide layer in a semiconductor device preparation of NiPt silicide. For example, as shown in FIG. 1A, a NiPt layer can be first deposited on a silicon layer on a semiconductor substrate. The coated semiconductor substrate then undergoes a thermal annealing process (e.g., at a temperature of from about 350° C. to about 450° C., such as about 400° C.) to cause Ni and Pt to diffuse into the silicon layer and silicon to diffuse into the NiPt layer. Subsequently, as shown in FIG. 1B, the annealed semiconductor substrate can be treated with an ammonium hydroxide/hydrogen peroxide composition (SC1) to remove a TiN cap, and then rinsed and optionally dried. As shown in FIG. 1C, the semiconductor substrate thus obtained can be passivated by using a passivation composition described above. As shown in FIG. 1D, residual NiPt can then be removed by treatment with an etching composition described below, rinsed with deionized water, and dried. In some embodiments, the process can also include a subsequent second annealing, followed by NiPt etch, rinse and drying steps.

Without wishing to be bound by theory, it is believed that the process of this disclosure first passivates the metal rich silicide layer so that the NiPt layer is largely removed during the NiPt etch without excessive oxidation of the metal rich silicide surface or excessive extraction of nickel and platinum species. Further, without wishing to be bound by theory, it is believed that the passivation step provides compatibility with exposed metal rich silicides that are present and exposed to the passivating composition after the annealing steps. The overall process is compatible with metals (such as Al, TiN, $Si_3N_4$, and W), metal rich silicide and monosilicide employed in advanced gate at the final stage of integration schemes.

In some embodiments, this disclosure features a method that includes (1) annealing a NiPt film disposed on a silicon film, the silicon film being disposed between the NiPt film and a semiconductor substrate; (2) treating the annealed NiPt film with a passivation composition, in which the passivation composition includes at least one compound containing a nitrate or nitrosyl ion, at least one sulfonic acid, and water, and the passivation composition is substantially free of a halide ion; (3) removing the passivation composition from the treated NiPt film; (4) treating the resulting NiPt film with an etching composition to remove the NiPt film, in which the etching composition contains at least one sulfonic acid, at least one compound containing a halide anion in which the halide anion is chloride or bromide, at least one compound containing a nitrate or nitrosyl ion, and water; and (5) removing the etching composition.

In some embodiments, this disclosure features a passivation and etch process which comprises a) providing a semiconductor substrate containing on its top surface a film resulting from the annealing of a NiPt film over a silicon film, b) treating the annealed NiPt film with a passivation composition containing at least one compound containing a nitrate or nitrosyl ion, at least one sulfonic acid, and water.

In some embodiments, the semiconductor substrate containing on its top surface a film resulting from the annealing of a NiPt film over a silicon film can be provided directly from the annealing step after it has been cooled, or can be provided after an ammonium hydroxide/hydrogen peroxide cleaning step. In the latter situation, it is preferred that the semiconductor substrate be rinsed and optionally dried.

Materials likely to be integrated into advanced integrated circuit design and exposed to the etching composition which are not desired to be etched include high-k materials (e.g., $HfO_2$, HfON, and HfSiON), Metal Gate Materials (e.g., TiN, TaN, TiAlN, W, and WN), interstitial layers (e.g., $Al_2O_3$ and $La_2O_5$), fill metals (e.g., aluminum and aluminum alloys, and tungsten), dielectrics (e.g., $Si_3N_4$ and $SiO_2$), semiconductors (e.g., p-doped and n-doped Si, polysilicon, Ge, SiGe, InGaAs, InAlAs, InSb, GaP, GaAs, and InP), silicides or contact materials of the metals to be etched (e.g. PtSi, NiSi, NiPtSi, NiPtSiGe, NiGe, NiPtGe, NiInSb, NiPtInSb, NiPtInGaAs, NiInGaAs, NiInAlAs, NiPtInAlAs, IrSi, $Ir_2Si_3$, and lanthanum group silicides (such as $ErSi_2$ and $HoSi_2$)). The etch compositions and processes of this disclosure are generally optimized in order to cause minimal or no damage to these films but yet remove the undesired metal (e.g., NiPt).

The passivation composition described in this disclosure can be brought into contact with the semiconductor substrate by any suitable means known to those skilled in the art. Such means include, but are not limited to, immersing the semiconductor substrate in a bath of the passivation composition, or spraying or streaming the passivation composition onto the semiconductor substrate. The spraying or streaming of the passivation composition can be terminated once the substrate is covered with the passivation composition, or can continue for a portion or all of the time the passivation composition is in contact with the semiconductor substrate. Typically, the semiconductor substrate and the passivation composition can be brought fully into contact in a few seconds (e.g., between 1-10 seconds). Depending on the specific process, additional passivation composition can be applied intermittently during the passivation period or continuously throughout the period.

The passivation step can include or exclude means of agitation. For example, in an immersion embodiment of the passivation step, the passivation solution can be circulated or stirred. Alternatively, the semiconductor substrate can be rotated or moved up and down during the passivation step. In streaming or spraying embodiments of the passivation step where the semiconductor substrate is positioned horizontally, the substrate can be rotated horizontally. In any of the embodiments described above, the semiconductor substrate can be vibrated to induce agitation. Those skilled in the art can determine optimum combinations of contacting and agitation means for the specific application.

The passivation step typically can run from approximately 30 seconds to about 30 minutes. The time will depend on the thickness of the film being passivated, the necessity to avoid deleterious effects on other exposed films, the particular etching composition being employed, the specific contacting means being employed, and the temperature employed. In some embodiments, the passivation period can be at least about 30 seconds (e.g., at least about 1 minute) and/or at most about 10 minutes (e.g., at most about 5 minutes). In some embodiments, the passivation period can range from about 30 seconds to about 5 minutes. In some embodiments, the passivation period can range from about 1 minute to about 10 minutes. In some embodiments, the passivation period can range from about 1 minute to about 5 minutes (e.g., about 3 minutes).

The temperature at which the passivation step is being performed can be at least about 25° C. (e.g., at least about 30° C., at least about 35° C., or at least about 40° C.) and/or at most about 100° C. (e.g., at most about 60° C., at most about 55° C., or at most about 50° C.), depending on the specific time and the nitrate or nitrosyl ion source being employed. In some embodiments, the temperature can range from about 25° C. to about 60° C. In some embodiments, the temperature can range from about 30° C. to about 60° C. In some embodiments, the temperature can range from about 30° C. to about 50° C. In some embodiments, the temperature can range from about 35° C. to about 60° C. In some embodiments, the temperature can range from about 40° C. to about 60° C. (e.g., 45° C.).

Subsequent to the passivation step, the semiconductor substrate can be rinsed with an aqueous solvent (i.e., a solvent containing water, preferably deionized water) to remove the passivation composition. Any suitable method of rinsing can be employed. Examples include immersion of the semiconductor substrate in stagnant or flowing water, or spraying or streaming water onto the semiconductor substrate. Agitation as described above during the passivation step can also be employed in the rinsing step. In some embodiments, the semiconductor substrate can be spun while rinsing.

In some embodiments, the aqueous solvent described above can include additional water soluble organic solvents. In such embodiments, the water soluble organic solvent can assist in removing organic residues or speed drying.

Subsequent to the rinsing step, the drying of the semiconductor substrate can optionally be accelerated using a drying means. Examples of drying means include spraying with a non-oxidizing gas such as nitrogen gas, spinning the substrate, and baking on a hot plate or in an oven.

The etching composition (described below) can be brought into contact with the semiconductor substrate by any suitable means known to those skilled in the art. Such means include, but are not limited to, immersing the semiconductor substrate in a bath of the etching composition, or spraying or streaming the etching composition onto the semiconductor substrate. The spraying or streaming of the etching composition can be terminated once the substrate is covered with the etching composition, or can continue for a portion or all of the time the etching composition is in contact with the semiconductor substrate. Typically, the semiconductor substrate and the etching composition can be brought fully into contact in a few seconds (e.g., between 1-10 seconds). Depending on the specific process, additional etchant may be applied intermittently during the etching period or continuously throughout the period.

The etching step include or exclude means of agitation. For example, in an immersion embodiment of the etching step, the etching solution may be circulated or stirred. Alternatively, the substrate can be rotated or moved up and down during the etching step. In streaming or spraying embodiments of the etching step where the semiconductor substrate is positioned horizontally, the substrate can be rotated horizontally. In any of the embodiments described above, the semiconductor substrate can be vibrated to induce agitation. Those skilled in the art can determine optimum combinations of contacting and agitation means for the specific application.

The etching period typically run from approximately 30 seconds to about 30 minutes. The time will depend on the thickness of the film being etched, the necessity to avoid deleterious effects on other exposed films, the particular etching composition being employed, the specific contacting means being employed and the temperature employed. In some embodiments, the etching period can be at least about 30 seconds (e.g., at least about 40 seconds or at least about 1 minute) and/or at most about 10 minutes (e.g., at most about 5 minutes or at most 3 minutes). In some embodiments, the etching period can range from about 30 seconds to about 5 minutes. In some embodiments, the etching period can range from about 40 seconds to about 2 minutes. In some embodiments, the etching period can range from about 1 minute to about 5 minutes. In some embodiments, the etching period can range from about 1 minute to about 3 minutes.

The temperature at which the NiPt film is etched is typically at least about 25° C. (e.g., at least about 30° C., at least about 35° C., or at least about 40° C.) and/or at most about 70° C. (e.g., at most about 60° C., at most about 55° C., or at most about 50° C.). In some embodiments, the temperature range at which the NiPt film is etched can be from about 25° C. to about 60° C. In some embodiments, the temperature range at which the NiPt film is etched can be from about 30° C. to about 60° C. In some embodiments, the temperature range at which the NiPt film is etched can be from about 25° C. to about 50° C. In some embodiments, the temperature range at which the NiPt film is etched can be from about 35° C. to about 60° C. In some embodiments, the temperature range at which the metal film is etched can be from about 40° C. to about 60° C.

Subsequent to the etching step, the semiconductor substrate can be rinsed with an aqueous solvent (i.e., a solvent containing water, preferably deionized water). Any suitable method of rinsing can be employed. Examples include immersion of the semiconductor substrate in stagnant or flowing water, or spraying or streaming water onto the semiconductor substrate. Agitation as described above during the etching period can be employed in the rinsing step.

in some embodiments, the aqueous solvent described above can include additional water soluble organic solvents. In such embodiments, the water soluble organic solvent can assist in removing organic residues or speed drying.

Subsequent to the rinsing step, the drying of the semiconductor substrate can optionally be accelerated using a drying means. Examples of drying means include spraying with a non-oxidizing gas such as nitrogen gas, spinning the substrate, and baking on a hot plate or in an oven.

In some embodiments, this disclosure features a passivation and etching process that includes (1) annealing a metal film disposed on a semiconductor substrate to form a metal containing contact film (which can serve as a semiconductor front end of line contact), the metal containing contact film being disposed between the metal film and the semiconductor substrate; (2) treating the annealed metal film and metal containing contact film with a passivation composition, the passivation composition comprising components that selectively passivate the metal containing contact film relative to the metal film; (3) removing the passivation composition from the treated metal film and the metal containing contact film; (4) treating the resulting metal film and metal containing contact film with an etching composition to remove the metal film; (5) and removing the etching composition. The metal film that can be used in this process can include Ni, Pt, NiPt, Ir, and lathanide group metals. The metal containing contact film formed in this process can include, but are not limited to, PtSi, NiSi, NiPtSi, NiPtSiGe, NiGe, NiPtGe, NiInSb, NiPtInSb, NiPtInGaAs, NiInGaAs, NiInAlAs, NiPtInAlAs, IrSi, $Ir_2Si_3$, and lanthanum group silicides (such as $ErSi_2$ and $HoSi_2$). The passivation composition can be an aqueous composition that contains chelating agents, oxidizing agents, and surfactants that would render the metal containing contact film inert to deep oxidation. Without wishing to be bound by theory, it is believed that the passivation can occur by various means including chemisorption through oxidation and/or complexation of the surface of the metal contact material, or physisorption on the metal contact material, to form a passivated material that would protect the metal containing contact film from oxidation during the metal etch step. In other words, the passivation can occur through a reaction or interaction between the passivation composition and the metal and/or the metal containing contact film rather than the deposition or addition of another film. In some embodiments, the passivation composition suitable for this process can include, but are not limited to, one or more of the ingredients (e.g., at least one sulfonic acid, at least one compound containing a nitrate or nitrosyl ion, and/or water) that can be used in the passivation compositions described above. The etching composition suitable for this process can include, but are not limited to, one or more of the ingredients (e.g., at least one sulfonic acid, at least one compound containing a halide ion, at least one compound containing a nitrate or nitrosyl ion, and/or water) that can be used in the etching compositions described herein. In some embodiments, the passivation or etching composition can be substantially free of fluoride and abrasive particles.

In some embodiments, the processes of this disclosure employ an etching composition (e.g., an aqueous etching composition) containing A) at least one sulfonic acid, B) at least one halide anion selected from the group consisting of chloride and bromide, C) at least one nitrate or nitrosyl ion, and D) water. The corresponding counter ions for the halide and nitrate anions (or nitrosyl cation) are also present.

One or more sulfonic acids can be employed in the etching composition of this disclosure. The sulfonic acids can be a solid or a liquid at room temperature as long as the final composition is a homogeneous liquid. Liquid or low melting solid sulfonic acids typically work effectively.

Preferred sulfonic acids in the etching composition are described by $R^1SO_3H$ (Formula (1)) or by Formula (2), or are a naphthalenesulfonic acid, which is optionally substituted with a $C_1$-$C_{12}$ alkyl group as described above for the passivation composition. Examples of sulfonic acids of Formulas (1) and (2) can be found above.

In some embodiments, the preferred etching composition contains sulfonic acids of Formula (1) in which $R^1$ is substituted or unsubstituted $C_1$-$C_4$ straight or branched alkyl, $C_1$-$C_4$ straight or branched perfluoroalkyl, $C_4$-$C_6$ straight or branched fluoroalkyl ether, and substituted or unsubstituted $C_7$-$C_{10}$ alicyclic groups.

In some embodiments, the more preferred etching composition contains sulfonic acids of Formula (1) in which $R^1$ is substituted or unsubstituted $C_1$-$C_4$ straight or branched alkyl or $C_1$-$C_4$ straight or branched perfluoroalkyl.

In some embodiments, the most preferred etching composition contains sulfonic acids of Formula (1) in which $R^1$ is substituted or unsubstituted $C_1$-$C_2$ alkyl or $C_1$-$C_2$ perfluoroalkyl.

In some embodiments, the preferred etching composition contains sulfonic acids of Formula (2) in which $R^2$, $R^3$, and $R^4$ are $C_1$-$C_4$ straight or branched alkyl, $C_1$, $NO_2$, $OH$, $SO_3H$, $F$, and $CO_2H$, where n is an integer selected from the group consisting of 0, 1 and 2.

In some embodiments, the more preferred etching composition contains sulfonic acids of Formula (2) in which $R^2$, $R^3$, and $R^4$ are $C_1$-$C_4$ straight or branched alkyl, $C_1$, $NO_2$, $OH$, $SO_3H$, $F$, and $CO_2H$, where n is an integer selected from the group consisting of 0 and 1.

In some embodiments, the most preferred etching composition contains sulfonic acids of Formula (2) in which $R^2$, $R^3$, and $R^4$ are $C_1$-$C_2$ alkyl, $C_1$, $NO_2$, $OH$, $F$, and $CO_2H$, where n is an integer selected from the group consisting of 0 and 1.

In some embodiments, a preferred etching composition contains at least one sulfonic acid of Formula (1) that includes, but is not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, butanesulfonic acid, perfluorobutanesulfonic acid, propanesulfonic acid, perfluoropropanesulfonic acid, methanedisulfonic acid, 2-methylpropanesulfonic acid, camphorsulfonic acids, ethanedisulfonic acid, benzylsulfonic acid, hydroxyphenylmethanesulfonic acid, naphthylmethanesulfonic acid, and norbornanesulfonic acids.

In some embodiments, a more preferred etching composition contains at least one sulfonic acid of Formula (1) that includes, but is not limited to, methanesulfonic acid, trifluoromethanesulfonic acid, ethanesulfonic acid, trifluoroethanesulfonic acid, perfluoroethylsulfonic acid, butanesulfonic acid, perfluorobutanesulfonic acid, propanesulfonic acid, perfluoropropanesulfonic acid, methanedisulfonic acid, 2-methylpropanesulfonic acid, ethanedisulfonic acid, benzylsulfonic acid, hydroxyphenylmethanesulfonic acid, and naphthylmethanesulfonic acid.

In some embodiments, a most preferred etching composition contains at least one sulfonic acid of Formula (1) that includes, but is not limited to, methanesulfonic acid, trifluoromethanesulfonic acid, ethanesulfonic acid, trifluoroethanesulfonic acid, perfluoroethylsulfonic acid, methanedisulfonic acid, and ethanedisulfonic acid.

In some embodiments, a preferred etching composition contains at least one sulfonic acid of Formula (2) that includes, but is not limited to, benzenesulfonic acid, chlorobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids (e.g., p-toluenesulfonic acid), methylchlorobenzenesulfonic acids, butylbenzenesulfonic acids, and dichlorobenzenesulfonic acids.

In some embodiments, a more preferred etching composition contains at least one sulfonic acid of Formula (2) that includes, but is not limited to, benzenesulfonic acid, chlorobenzenesulfonic acids, fluorobenzenesulfonic acids, hydroxybenzenesulfonic acids, nitrobenzenesulfonic acids, benzenedisulfonic acids, toluenesulfonic acids (e.g., p-toluenesulfonic acid), and butylbenzenesulfonic acids.

In some embodiments, a most preferred etching composition contains at least one sulfonic acid of Formula (2) that includes, but is not limited to, benzenesulfonic acid, chlorobenzenesulfonic acids, fluorobenzenesulfonic acids, hydroxybenzenesulfonic acids, nitrobenzenesulfonic acids, and toluenesulfonic acids (e.g., p-toluenesulfonic acid).

In some embodiments, the at least one sulfonic acid of the etching composition includes a mixture of one or more of a first sulfonic acid and one or more of a second sulfonic acid having higher hydrophobicity than the first sulfonic acid. The first sulfonic acid can be selected from the group consisting of acids of Formula (1): $R^1SO_3H$, where $R^1$ can be an unsubstituted $C_1$-$C_4$ linear or branched sulfonic acid.

The second sulfonic acid of the etching composition can be selected from the group consisting of sulfonic acids of formula (2):

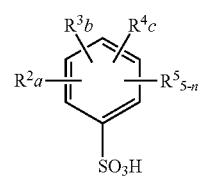

Formula (2)

In Formula (2), $R^2$, $R^3$, and $R^4$ can be independently selected from the group consisting of $C_1$-$C_{12}$ straight or branched alkyl, $C_3$-$C_{12}$ cyclic alkyl, Cl, Br, F; $R^5$ can be H; and a, b, c, and n can be integers selected from the group consisting of 0, 1, 2, and 3 with the relationship a+b+c=n.

The second sulfonic acid of the etching composition can also be a compound of Formula (1): $R^1SO_3H$, where $R^1$ can be substituted or unsubstituted $C_6$-$C_{12}$ straight, or branched alkyl, substituted or unsubstituted $C_6$-$C_{12}$ cyclic alkyl, $C_1$-$C_{12}$ straight or branched perfluoroalkyl, $C_3$-$C_{12}$ cyclic perfluoroalkyl, $C_1$-$C_{12}$ straight or branched fluoroalkyl ether, $C_3$-$C_{12}$ cyclic fluoroalkyl ether, or substituted or unsubstituted $C_7$-$C_{12}$ alicyclic groups. Examples of substituents include, but are not limited to, $C_1$-$C_4$ alkyl groups, phenyl groups, and fluorine atoms. Hydrophilic groups (e.g., OH, COOH, $SO_3H$, or $NO_2$) are excluded from substituents suitable for the second sulfonic acid of the etching composition.

Examples of the first sulfonic acids of Formula (1) of the etching composition include, but are not limited to, methanesulfonic acid, ethanesulfonic acid, propanesulfonic acid, and butanesulfonic acid.

Examples of the second sulfonic acids of Formula (2) of the etching composition include, but are not limited to, benzenesulfonic acid, chlorobenzenesulfonic acids, bromobenzenesulfonic acids, fluorobenzenesulfonic acids, toluenesulfonic acids (e.g., p-toluenesulfonic acid), methylchlorobenzenesulfonic acids, dodecylbenzenesulfonic acids, butylbenzenesulfonic acids, cyclohexylbenzenesulfonic acids, dichlorobenzenesulfonic acids, dibromobenzenesulfonic acids, and 2,4,5-trichlorobenzenesulfonic acid.

Other sulfonic acids suitable as the second sulfonic acid of the etching composition include, but are not limited to, trifluoromethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, perfluorobutanesulfonic acid, perfluoropropanesulfonic acid, octylsulfonic acid, pefluorooctanesulfonic acid, cyclohexylsulfonic acid, camphorsulfonic acids, perfluorohexanesulfonic acid, benzylsulfonic acid, naphthylmethanesulfonic acid, and norbornanesulfonic acid.

Preferred sulfonic acids suitable as the second sulfonic acid of the etching composition are those of Formula (1) where $R^1$ is $C_1$-$C_{12}$ straight or branched perfluoroalkyl and those of Formula (2) where $R^2$ is $C_1$-$C_{12}$ straight or branched alkyl, a is 1, and b and c are 0.

In some embodiments, the at least one sulfonic acid of the etching composition is a naphthalenesulfonic acid, which is optionally substituted with a $C_1$-$C_{12}$ alkyl group. Examples of substituted or unsubstituted naphthalenesulfonic acid of the etching composition can be the same as those described above for the passivation composition. In some embodiments, the at least one sulfonic acid of the etching composition is a mixture of one or more of the first sulfonic acids of Formula (1) described above and one or more of a second sulfonic acid in which the second sulfonic acid is a naphthalenesulfonic acid optionally substituted with a $C_1$-$C_{12}$ alkyl group.

In some embodiments, the etching composition includes the first sulfonic acid and the second sulfonic acid in a weight ratio of at least about 10:1 (e.g., at least about 20:1, or at least about 30:1) and/or at most about 150:1 (e.g., at most about 60:1, at most about 40:1, or at most about 20:1). In some embodiments, the first sulfonic acid and the second sulfonic acid of the etching composition are employed in a weight ratio of from about 10:1 to about 150:1. In some embodiments, the first sulfonic acid and the second sulfonic acid of the etch composition are employed in a weight ratio of from about 20:1 to about 60:1. In some embodiments, the first sulfonic acid and the second sulfonic acid of the etch composition are employed in a weight ratio of from about 30:1 to about 40:1. In some embodiments, the first sulfonic acid and the second sulfonic acid of the etch composition are employed in a weight ratio of from about 10:1 to about 20:1.

Performance of the etching composition described herein can be optimized based on the specific metals present on the device being etched, and the relative hydrophobicity and acidity of the first and second sulfonic acids being employed.

In general, the etching composition described in this disclosure employs one or more sources of halide anion selected from chloride or bromide anions. Such sources can provide chloride anions from the same or different classes of compounds, bromide anions from the same or different classes of compounds, or can provide both chloride and bromide anions from the same or different classes of compounds.

Any suitable source of ionic chloride or bromide compounds can be employed in the etching composition of this disclosure. Care should be taken that the chloride (or bromide) compounds do not contain groups unstable to the strong acid conditions. Suitable sources of ionic chloride and bromide include, but are not limited to, hydrogen chloride (bromide), ammonium chloride (bromide), quaternary ammonium chlorides (bromides), amine hydrochlorides (hydrobromides), nitrogen based aromatic and pseudoaromatic hydrochlorides (hydrobromides), phosphonium chlorides (bromides), and metal chlorides (bromides).

In some embodiments, preferred sources of ionic bromides and chlorides include, but are not limited to, hydrogen chloride, hydrogen bromide, ammonium chloride, ammonium bromide, quaternary ammonium chlorides, quaternary ammonium bromides, amine hydrochlorides, amine hydrobromides, nitrogen based aromatic and pseudoaromatic hydrochlorides, and nitrogen based aromatic and pseudoaromatic hydrobromides.

In some embodiments, more preferred sources of ionic bromides and chlorides include, but are not limited to, hydrogen chloride, hydrogen bromide, ammonium chloride, ammonium bromide, quaternary ammonium chlorides, quaternary ammonium bromides, and nitrogen based aromatic and pseudoaromatic hydrochlorides, and nitrogen based aromatic and pseudoaromatic hydrobromides.

In some embodiments, the most preferred sources of ionic bromides and chlorides include, but are not limited to, hydrogen chloride, ammonium chloride, ammonium bromide, and quaternary ammonium chlorides.

Examples of quaternary ammonium chlorides (or bromides) include, but are not limited to, those compounds described by $R^1R^2R^3R^4N^+Cl^-$ (or BC) where $R^1$, $R^2$, $R^3$, and $R^4$ independently are substituted or unsubstituted alkyl or phenyl. Examples of $R^1$, $R^2$, $R^3$, and $R^4$ include, but are not limited to, methyl, ethyl, propyl, butyl, pentyl, octyl, decyl, and phenyl. Examples of substituents include, but are not limited to, fluoride, $C_1$-$C_4$ alkyl, and substituted or unsubstituted phenyl. Preferred quaternary ammonium chlorides (or bromides) are those where $R^1$, $R^2$, $R^3$, and $R^4$ are $C_1$-$C_4$ alkyl. More preferred quaternary ammonium chlorides (or bromides) are those where $R^1$, $R^2$, $R^3$, and $R^4$ are $C_1$-$C_2$ alkyl.

Specific examples of quaternary ammonium chlorides include, but are not limited to, tetramethylammonium chloride, ethyltrimethylammonium chloride, diethyldimethyl ammonium chloride, methyltriethylammonium chloride, tetraethylammonium chloride, phenyltrimethyl ammonium chloride, dimethyldiphenylammonium chloride, benzyl trimethylammonium chloride, tetrapropylammonium chloride, tetrabutylammonium chloride, dimethyldibutylammonium chloride, decyltrimethylammonium chloride, pentyltrimethylammonium chloride, tetra-isopropylammonium chloride, decyltrimethylammonium chloride, 2,2,2-trifluoroethyltrimethylammonium chloride, fluorophenyl trimethyl ammonium chloride, chlorophenyltrimethylammonium chloride, and methylphenyltrimethylammonium chloride. Tetramethylammonium chloride, tetraethylammonium chloride, methyltriethylammonium chloride, ethyltrimethylammonium chloride are preferred from this class of chlorides.

Specific examples of quaternary ammonium bromides include, but are not limited to, tetramethylammonium bromide, methyltriethylammonium bromide, diethyldimethyl ammonium bromide, ethyltrimethylammonium bromide, tetraethylammonium bromide, phenyltrimethyl ammonium bromide, dimethyldiphenylammonium bromide, benzyl trimethylammonium bromide, tetrapropylammonium bromide, tetrabutylammonium bromide, dimethyldibutylammonium bromide, decyltrimethylammonium bromide, pentyltrimethylammonium bromide, tetra-isopropylammonium bromide, decyltrimethylammonium bromide, 2,2,2-trifluoroethyltrimethylammonium bromide, fluorophenyl trimethyl ammonium bromide, chlorophenyltrimethylammonium bromide, and methylphenyltrimethylammonium bromide. Tetramethylammonium bromide, tetraethylammonium bromide, methyltriethylammonium bromide, ethyltrimethylammonium bromide are preferred from this class of bromides.

Examples of amine hydrochlorides (or hydrobromides) include, but are not limited to, the reaction products of HCl (or HBr) with mono-, di-, and trisubstituted amine compounds, which contain 1 or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic hydrochlorides (or hydrobromides), include, but are not limited to, the reaction products of HCl (or HBr) with pyridine, pyrole, pyrazole, imidazole, pyrazine, pyrimidine, and their substituted derivatives.

Examples of phosphonium chlorides include tetramethylphosphonium chloride, tetraethylphosphonium chloride, tetrapropylphosphonium chloride, tetrabutylphosphonium chloride, dimethyldiethylphosphonium chloride, phenyltrimethylphosphonium chloride, and fluorophenyltrimethylphosphonium chloride.

Examples of phosphonium bromides include tetramethylphosphonium bromide, tetraethylphosphonium bromide, tetrapropylphosphonium bromide, tetrabutylphosphonium bromide, dimethyldiethylphosphonium bromide, phenyltrimethylphosphonium bromide, and fluorophenyltrimethylphosphonium bromide.

Examples of metal chlorides include sodium chloride, lithium chloride, copper chloride, iron chloride, magnesium chloride, nickel chloride, palladium chloride, platinum chloride, tin chloride, and zinc chloride. Examples of metal bromides include sodium bromide, lithium bromide, copper bromide, iron bromide, magnesium bromide, nickel bromide, palladium bromide, platinum bromide, tin bromide, and zinc bromide.

In general, one or more nitrates from the same or different classes can be employed in the etching composition described herein. Similarly, one or more nitrosyl salts from the same or different classes can be employed. Alternatively, a mixture of nitrate(s) and nitrosyl salt(s) from the same or different classes can be employed.

Any suitable source of ionic nitrate anions or nitrosyl salts can be employed in the etching composition of this disclosure. Suitable ionic nitrate sources include, but are not limited to, nitric acid, ammonium nitrate, quaternary ammonium nitrates, substituted ammonium nitrates, nitrogen based aromatic and pseudoaromatic reaction products with nitric acid, phosphonium nitrates, and metal nitrates.

In some embodiments, preferred sources of ionic nitrate and nitrosyl salts include, but are not limited to, nitric acid, ammonium nitrate, quaternary ammonium nitrates, nitrogen based aromatic and pseudoaromatic reaction products with nitric acid. More preferred sources of ionic nitrate and nitrosyl salts include, but are not limited to, nitric acid, ammonium nitrate, and quaternary ammonium nitrates. The most preferred sources of ionic nitrate are nitric acid and ammonium nitrate.

Specific examples of quaternary ammonium nitrates include, but are not limited to, tetramethylammonium nitrate, ethyltrimethylammonium nitrate, diethyldimethyl ammonium nitrate, methyltriethylammonium nitrate, tetraethylammonium nitrate, phenyltrimethyl ammonium nitrate, dimethyldiphenylammonium nitrate, benzyl trimethylammonium nitrate, tetrapropylammonium nitrate, tetrabutylammonium nitrate, dimethyldibutylammonium nitrate, decyltrimethylammonium nitrate, pentyltrimethylammonium nitrate, tetra-isopropylammonium nitrate, decyltrimethylammonium nitrate, 2,2,2-trifluoroethyltrimethylammonium nitrate, fluorophenyl trimethyl ammonium nitrate, chlorophenyltrimethylammonium nitrate, and methylphenyltrimethylammonium nitrate. Tetramethylammonium nitrate, tetraethylammonium nitrate, methyltriethylammonium nitrate, ethyltrimethylammonium nitrate are preferred from this class of nitrates.

Examples of substituted ammonium nitrates include, but are not limited to, the reaction products of nitric acid with mono-, di-, and trisubstituted amine compounds, which contain one or more amine functional groups. Suitable amine compounds include, but are not limited to, methylamine, dimethylamine, trimethylamine, ethylamine, diethylamine, triethylamine, propylamine, dipropylamine, tripropylamine, pyrrolidine, piperidine, ethylmethylamine, ethyldimethylamine, phenylamine, diphenylamine, methyldiphenylamine, dimethylphenylamine, triphenylamine, benzylamine, benzylmethylamine, dibenzylamine, butylamine, dibutylamine, tributylamine, ethylenediamine, triethylenediamine, diethylenetriamine, aniline, dimethylaniline, methylaniline, phenylenediamine, piperazine, and bis-(aminophenyl)methane.

Examples of nitrogen based aromatic and pseudoaromatic reaction products with nitric acid, include, but are not limited to, the reaction products of nitric acid with pyridine, pyrole, pyrazole, imidazole, pyrazine, pyrimidine, and their substituted derivatives.

Examples of phosphonium nitrates include tetramethylphosphonium nitrate, tetraethylphosphonium nitrate, tetrapropylphosphonium nitrate, tetrabutylphosphonium nitrate, dimethyldiethylphosphonium nitrate, phenyltrimethylphosphonium nitrate, and fluorophenyltrimethylphosphonium nitrate.

Examples of metal nitrates include sodium nitrate, lithium nitrate, copper nitrates, iron nitrates, magnesium nitrate, nickel nitrate, palladium nitrate, platinum nitrate, and tin nitrate.

Suitable nitrosyl salts include nitrosyl chloride, nitrosyl bromide, nitrosyl fluoride, nitrosyl tetrafluoroborate, and nitrosyl hydrogen sulfate. Nitrosyl hydrogen sulfate and nitrosyl tetrafluoroborate are preferred. Nitrosyl hydrogen sulfate is more preferred.

Water (preferably deionized water), cations for the nitrate and chloride (bromide), anions for the nitrosyl, and optional additives complete the etching composition of this disclosure. In some embodiments, water is at least about 3% of the etching composition so that, once the etching occurs, the etching products can be dissolved in the etching composition. The water can be provided from the sulfonic acid, the chloride (or bromide) source, or the nitrate source, or can be added from a source in addition to those sources.

In some embodiments of the disclosure, the aqueous etching composition is essentially free of fluoride anions (i.e., $F^-$). In some embodiments of the disclosure, the aqueous etching composition is essentially free of abrasives. In some embodiments of the disclosure, the aqueous etching composition is essentially free of both fluoride anions and abrasives.

In some embodiments of the disclosure, an aqueous etching composition consists essentially of A) about 60% to about 95% of at least one sulfonic acid, B) about 0.01%-2% of at least one halide anion selected from the group consisting of chloride and bromide, C) about 0.1%-20% of at least one nitrate anion or nitrosyl cation, D) corresponding counter ions for the halide and nitrate anions (or nitrosyl cation), and E) at least about 3% water.

In some embodiments, the sulfonic acid is about 25%-95% of the aqueous etching composition described herein. In some embodiments, the sulfonic acid is about 60%-95% of the aqueous etching composition. In some embodiments, the sulfonic acid is about 60%-80% of the aqueous etching composition. In some embodiments, the sulfonic acid is about 60%-75% of the aqueous etching composition.

In some embodiments, the sulfonic acid is about 25%-60% (e.g., about 25-50% or about 30-45%) of the aqueous etching composition described herein.

In some embodiments, the halide anion is about 0.01% to about 5% of the aqueous etching composition described herein. In some embodiments, the halide anion is about 0.01% to about 2% of the aqueous etching composition. In some embodiments, the halide anion is about 0.01% to about 1% of the aqueous etching composition. In some embodiments, the halide anion is about 0.1% to about 0.5% of the aqueous etching composition.

In some embodiments, the halide anion is about 3% to about 5% (e.g., about 3% to about 4.5% or about 3.5% to about 4.5%) of the aqueous etching composition.

In some embodiments, the etching composition can include at least about 0.1% (e.g., at least about 0.5%, at least about 1%, at least about 2%, at least about 3%, or at least about 5%) and/or at most about 20% (e.g., at most about 15%, at most about 10%, or at most about 5%) of a compound containing a nitrate or nitrosyl ion.

In some embodiments, the etching composition can include from about 0.1% to about 20% of the nitrate or nirosyl ion. Other suitable ranges of the nitrate or nirosyl ion in the etching composition include from about 0.5% to about 10%, from about 0.5% to about 5%, from about 0.5% to about 2.5%, from about 2.5% to about 7%, from about 2.5% to about 6%, or about 3% to about 5%.

In some embodiments, the aqueous etching composition described herein includes at least about 3% (e.g., at least about 14%, at least about 20%, at least about 30%, at least about 35%, or at least about 40%) and/or at most about 60% (e.g., at most about 50%, at most about 45%, at most about 40%, or at most about 35%) of water. In some embodiments, the water is from about 3% to about 60% of the aqueous etching composition described herein. In some embodiments, the water is from about 3% to about 40% of the aqueous etching composition. In some embodiments, the water is from about 14% to about 40% of the aqueous etching composition. In some embodiments, the water is from about 20% to about 35% of the aqueous etching composition. In some embodiments, the water is from about 30% to about 60% of the aqueous etching composition. In some embodiments, the water is from about 35% to about 50% of the aqueous etching composition. In some embodiments, the water is from about 40% to about 45% of the aqueous etching composition.

The pH of the etching composition described herein can be at most about 2 (e.g., at most about 1.5, at most about 1, or at most about 0) and/or at least about −5 (e.g., at least about −3, at least about −2, or at least about −1). A preferred pH is from about 1.5 to about −2. A more preferred pH is from about 1 to about −2. The most preferred pH is from about −2 to about 0.

Optional additives that can be employed in the etching composition described herein to optimize performance or lower cost include solvents, carboxylic acids or other complexing agents, anti-corrosion agents, viscosity reducing agents and surfactants. The carboxylic acids can be used to improve the metal ion solubility by complimenting the halide complexation. The surfactants can be used in their traditional purpose as surface tension modifiers but also as wetting agents to inhibit corrosion on various exposed surfaces such as aluminum, silicon dioxide, silicon nitride, silicide, tungsten, and TiN. The solvents allow modification of the Hansen solubility parameters for the solution to target some organic residue removal and change the oxidation potential of the solution. Both the same class and different types of additives can be employed in the etching composition described herein. Care should be taken that the additives are stable under low pH conditions.

In some embodiments, the etching composition described herein includes one or more organic solvents. In some embodiments, the organic solvents suitable for use in the etching composition described herein exclude stabilizers such as glycols, ethers, and polyols. Examples of specific organic solvents (or stabilizer) that can be excluded from the etching composition described herein include glyme, diglyme, triglyme, crown ethers, ethylene glycol, tripropylene glycol, and propylene glycol methyl ether. In some embodiments, the etching composition described herein can include one or more the excluded solvents described above.

The concentration of an additive can depend on the effectiveness or purpose of the specific additive. For example, the concentration of an additional solvent can be from about 3% to about 35% of the etching composition. As another example, the concentrations of carboxylic acids, other chelating agents, viscosity reducing agents, and surfactants can be from about 0.001% to about 10% of the etching composition.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a stir bar at 200 rpm unless otherwise noted.

General Procedure 1

Formulation of Passivation Compositions

Passivation compositions (except for CPC 4) were prepared by adding the nitrate or nitrosyl source, while stirring, to the calculated amount of ultra-pure deionized water (DI water) with or without the presence of one or more sulfonic acid(s). The solution was allowed to equilibrate and the pH of the passivation composition was measured, if needed. CPC 4 was prepared by adding the two acids to the calculated amount of ultra-pure deionized water (DI water) while stirring, and then adding slowly the hydrogen peroxide.

The passivation compositions are detailed in Table 1. The concentrations of the components to be added to the passivation compositions are noted in the footnotes to Table 1.

General Procedure 2

Formulation of Etching Compositions

Etching compositions were prepared by adding, while stirring, to the calculated amount of ultra-pure deionized water (DI water) the halide source(s), the sulfonic acid(s), and the nitrate source. After a uniform solution was achieved, any optional additives (except optional pH adjusting agents), if used, were added. The solution was allowed to equilibrate and the pH of the etch composition was measured, if needed. The etch compositions are detailed in Table 2. The concentrations of the components to be added to the etch compositions are noted in the footnotes to Table 2.

General Procedure 3

Passivation and Etching Processes

The NiPt patterned wafers, containing materials and features shown in FIGS. 1A-1D, were diced into test coupons containing these key features for the etching tests. In FIG. 1, PMOS refers to a p-type metal on silicon; and NMOS refers to an n-type metal on silicon.

Typically, on the top of the NiPt layer, there can be a TiN cap (as shown in FIG. 1A) with a thickness of around 50-100 Å which can be removed by standard SC1 solution (1:1:5 part in volume 29% $NH_4OH$: 30% $H_2O_2$: $H_2O$) at room temperature for around 10 minutes prior to the passivation and etching processes.

Prior to immersion of the coupon into the passivation composition, the composition is pre-heated to the test condition temperature of 30° C.-90° C. with controlled stirring. The test coupon is held using 4" long plastic locking tweezers, whereby the coupon can then be suspended into a 500 ml volume glass beaker containing approximately 200 ml of the passivation composition. The passivation process is then carried out by placing the coupon, held by the plastic tweezers, into the heated composition in such a way that the NiPt layer containing side of the coupon faced the stir bar. The coupon is left static in the passivation composition for a period indicated in Table 3 depending on the experiment while the composition is kept at the test temperature under controlled stirring.

After the passivation period was completed, the coupon was quickly removed from the passivation composition and placed under direct DI water flow (2 L/min) perpendicular to the coupon surface at ambient DI water temperature (20-26° C.) for 50-80 seconds. The coupon was then immediately exposed to a nitrogen gas stream from a hand held nitrogen blowing gun which caused any droplets on the coupon surface to be blown off the coupon, and further completely dried the coupon device surface.

Following this final nitrogen drying step, the coupon was placed into the etch composition and the same process was followed as for the passivation step for the time indicated in Table 3. After the etching step, rinsing and drying, the coupon was removed from the plastic tweezers holder and placed into a covered plastic carrier with the device side up for short term storage no greater than about 2 hours. The coupon surface was then analyzed by the methods described in other General Procedures and reported in the tables.

General Procedure 4

Etching Process without Passivation

The NiPt patterned wafers, containing materials and features shown in FIGS. 1A-1D, were diced into test coupons containing these key features for the etching tests. In FIG. 1, PMOS refers to a p-type metal on silicon; and NMOS refers to an n-type metal on silicon.

Any TiN cap (as shown in FIG. 1A) is removed as described in General Procedure 3.

Prior to immersion of the coupon into the etching composition, the composition was pre-heated to the test condition temperature of 50° C.-60° C. with controlled stirring. The test coupon was held using 4" long plastic locking tweezers, whereby the coupon could then be suspended into a 500 ml volume glass beaker containing approximately 200 ml of the etching composition. The etching test was then carried out by placing the coupon, held by the plastic tweezers, into the heated etching composition in such a way that the NiPt layer containing side of the coupon faced the stir bar. The coupon was left static in the etching composition for a period of indicated in Table 3 while the composition was kept at the test temperature under controlled stirring.

After the etching period was completed, the coupon was quickly removed from the etching composition and placed under direct DI water flow (2 L/min) perpendicular to the coupon surface at ambient DI water temperature (20-26° C.) for 50-80 seconds. Then the coupon was immediately exposed to a nitrogen gas stream from a hand held nitrogen blowing gun which caused any droplets on the coupon surface to be blown off the coupon, and further to completely dry the coupon device surface. The coupon surface was then analyzed by the methods described in other General Procedures and reported in the tables.

General Procedure 5

Oxidation Analysis

The oxidation and etching of the substrates were evaluated using Electron Spectroscopy for Chemical Analysis (ESCA) and a SEM Pad. The profile of the degree of oxidation of the NiPt silicide was measured by ESCA using Ar ion etching at a rate of approximately 10 angstroms/second on a 40 μm spot size down for the top 130 angstroms of the film. The SEM pad, a 60×100 μm rectangular structure on the die that contained residual NiPt on metal rich $Ni_xPt_ySi_z$ was used to evaluate the etching of the residual NiPt and oxidation of the underlying metal rich silicides.

Passivation and Etchant Formulations

The passivation compositions in Table 1 were prepared according to General Procedure 1. The etching compositions in Table 2 were prepared according to General Procedure 2.

TABLE 1

Passivation Compositions

| Passivation Composition | Oxidizer (1)/ Amount [g] | Oxidizer (2)/[g] | Sulfonic acid (1)/ Amount [g] | Sulfonic acid (2)/ Amount [g] | Water Added [g] | Total Water from all sources (g) |
|---|---|---|---|---|---|---|
| CPC1 | HNO₃/7.143 | | | | 192.86 | 195 |
| CPC2 | HNO₃/8.57 | | | | 191.43 | 194 |
| CPC3 | HNO₃/14.29 | | | | 185.71 | 190 |
| CPC4 | H₂SO₄/47.56 | H₂O₂/9.58 | MSA/142.86 | | | 51.47 |
| PC1 | HNO₃/14.29 | | MSA/173.60 | PTSA/12.103 | | 60.36 |
| PC2 | HNO₃/7.143 | | MSA/180.75 | PTSA/12.103 | | 60.36 |
| PC3 | HNO₃/28.5 | | MSA/159.33 | PTSA/12.103 | | 60.36 |
| PC4 | HNO3/26.67 | | MSA/162.05 | PTSA/11.30 | | 60.35 |

Notes:
Nitric acid (HNO₃) was added as 70% nitric acid solution in water; MSA was added as a 70% methanesulfonic acid solution in water; PTSA was added as a 67% p-toluenesulfonic acid solution in water; H₂SO₄ was added as 96% sulfuric acid; and H₂O₂ was added as 30% hydrogen peroxide in water.

TABLE 2

Etching Compositions

| Etch Composition | Halide compound/ Amount [g] | nitrate source/ Amount [g] | Sulfonic acid (1)/Amount [g] | Sulfonic acid (2)/Amount [g] | Water Added [g] | Total Water from all sources (g) |
|---|---|---|---|---|---|---|
| EC1 | HCl/0.27 | HNO₃/7.143 | MSA/192.587 | | | 60.09 |
| EC2 | HCl/0.27 | HNO₃/7.143 | MSA/186.536 | PTSA/6.051 | | 60.325 |
| EC3 | HCl/1.88 | HNO₃/7.09 | MSA 185.04 | PTSA/6.00 | | 60.8 |
| EC4 | HCl/0.27 | HNO₃/7.143 | MSA/191.59 | TFMSA/1 | | 59.79 |
| EC5 | HCl/0.27 | HNO₃/7.143 | MSA/169.587 | TFMSA/16 | 7 | 60.185 |
| EC6 | HCl/0.27 | HNO₃/7.143 | MSA/178.59 | BSA/14 | | 57.69 |
| CEC1 | HCl/21.62 | HNO₃/20.01 | MSA/73.80 | | 84.57 | 126.33 |

Hydrochloric acid (HCl) was added as a 37% hydrochloric acid solution in water; Nitric acid (HNO₃) was added as a 70% nitric acid solution in water; MSA was added as a 70% methanesulfonic acid solution in water; PTSA was added as a 67% p-toluenesulfonic acid solution in water; BSA was added as a benzenesulfonic acid monohydrate solid; and TFMSA was added as a neat liquid containing trifluoromethanesulfonic acid.

Examples 1-10 and Comparative Examples C1-C14

Comparative Examples C1-C14 and Examples 1-10 were performed according to General Procedure 4 or General Procedure 3 according to the conditions described in Table 3. Analyses of results from these experiments were performed according to General Procedures 5.

TABLE 3

Passivation and Etch Process Examples and Comparative Examples

| Example # | Passivation Solution | Temp [C.] | Time [min] | Rinse/Dry | Etching Solution | Temp [C.] | Time [min] | Rinse/Dry |
|---|---|---|---|---|---|---|---|---|
| C1 | — | — | — | — | EC2 | 50 | 1 | DIW/N₂ dry |
| C2 | — | — | — | — | EC4 | 50 | 1 | DIW/N₂ dry |
| C3 | — | — | — | — | EC5 | 50 | 1 | DIW/N₂ dry |
| C4 | — | — | — | — | EC6 | 50 | 1 | DIW/N₂ dry |
| C5 | — | — | — | — | CEC1 | 50 | 1 | DIW/N₂ dry |
| C6 | CPC1 | 50 | 5 | DIW/N₂ dry | EC2 | 50 | 2 | DIW/N₂ dry |
| C7 | CPC2 | 50 | 5 | DIW/N₂ dry | EC2 | 50 | 2 | DIW/N₂ dry |
| C8 | CPC2 | 60 | 0.5 | DIW/N₂ dry | EC2 | 60 | 1 | DIW/N₂ dry |
| C9 | CPC2 | 50 | 1.0 | DIW/N₂ dry | EC2 | 60 | 1 | DIW/N₂ dry |
| C10 | CPC2 | 60 | 0.5 | DIW/N₂ dry | EC2 | 60 | 2 | DIW/N₂ dry |
| C11 | CPC2 | 60 | 1.0 | DIW/N₂ dry | EC2 | 60 | 2 | DIW/N₂ dry |
| C12 | CPC3 | 50 | 1 | DIW/N₂ dry | EC2 | 60 | 1 | DIW/N₂ dry |
| 1 | PC1 | 40 | 1 | DIW/N₂ dry | EC2 | 50 | 1 | DIW/N₂ dry |
| 2 | PC1 | 40 | 5 | DIW/N₂ dry | EC2 | 50 | 1 | DIW/N₂ dry |
| 3 | PC1 | 45 | 1 | DIW/N₂ dry | EC2 | 50 | 1 | DIW/N₂ dry |
| 4 | PC1 | 45 | 5 | DIW/N₂ dry | EC2 | 50 | 1 | DIW/N₂ dry |
| 5 | PC1 | 50 | 1 | DIW/N₂ dry | EC2 | 50 | 1 | DIW/N₂ dry |
| 6 | PC1 | 50 | 5 | DIW/N₂ dry | EC2 | 50 | 1 | DIW/N₂ dry |
| 7 | PC2 | 50 | 5 | DIW/N₂ dry | EC2 | 50 | 2 | DIW/N₂ dry |

TABLE 3-continued

Passivation and Etch Process Examples and Comparative Examples

| Example # | Passivation | | | | Etching | | | |
|---|---|---|---|---|---|---|---|---|
| | Solution | Temp [C.] | Time [min] | Rinse/Dry | Solution | Temp [C.] | Time [min] | Rinse/Dry |
| 8 | PC3 | 50 | 5 | DIW/$N_2$ dry | EC2 | 50 | 2 | DIW/$N_2$ dry |
| 9 | PC4 | 50 | 5 | DIW/$N_2$ dry | EC3 | 50 | 2 | DIW/$N_2$ dry |
| C13 | CPC4 | 50 | 2 | DIW/$N_2$ dry | EC2 | 50 | 1 | DIW/$N_2$ dry |
| C14 | CPC4 | 90 | 2 | DIW/$N_2$ dry | EC2 | 50 | 1 | DIW/$N_2$ dry |
| 10 | PC2 | 50 | 2 | DIW/$N_2$ dry | EC2 | 50 | 1 | DIW/$N_2$ dry |

TABLE 4

Ratings for NiPt Etch and Metal rich silicide oxidation performance after the process indicated in Table 3.

| Example # | NiPt Etch (1 to 10) | NiPtSi (undoped) Oxidization (1 to 10) SEM-pad | NiPtSi (undoped) Oxidization (1 to 10) ESCA-O profile | NiPtSi (n doped) Oxidization (1 to 10) SEM-pad | NiPtSi (n doped) Oxidization (1 to 10) ESCA-O profile | NiPtSi (p-doped) Oxidization (1 to 10) SEM-pad |
|---|---|---|---|---|---|---|
| C1 | 9.5 | 6 | 9 | 5 | 7 | 5 |
| C2 | 9 | 6 | 9 | N/A | 4 | N/A |
| C3 | 9 | 6 | 8.5 | 5 | 8 | 5 |
| C4 | 9 | 8 | N/A | 5 | 7 | 5 |
| C5 | 10 | 1 | 1 | 1 | 1 | N/A |
| C6 | 9.5 | N/A | N/A | 8 | 10 | N/A |
| C7 | 9.5 | N/A | N/A | 8 | 10 | 8.5 |
| C8 | 9 | 7 | N/A | 6 | N/A | 6.5 |
| C9 | 9 | 7 | N/A | 3.5 | N/A | 6.5 |
| C10 | 9.5 | 7 | N/A | 2 | N/A | 7.5 |
| C11 | 8 | 6.5 | N/A | 3 | N/A | 6.5 |
| C12 | 8.5 | 8.5 | N/A | 3.5 | N/A | 7.5 |
| 1 | 9.5 | N/A | N/A | 6 | N/A | 7 |
| 2 | 9.5 | N/A | N/A | 9 | N/A | 9.5 |
| 3 | 9.5 | N/A | N/A | 8 | N/A | 8 |
| 4 | 9.5 | N/A | N/A | 9.5 | N/A | 9.5 |
| 5 | 9 | N/A | N/A | 9 | N/A | 9.5 |
| 6 | 10 | N/A | N/A | 10 | 10 | 10 |
| 7 | 8.5 | N/A | N/A | 9 | N/A | 8 |
| 8 | 8 | N/A | N/A | 10 | N/A | 9 |
| 9 | 8 | N/A | N/A | 9.5 | N/A | N/A |
| C13 | 2 | 10 | N/A | 10 | N/A | N/A |
| C14 | 5 | 10 | N/A | 10 | N/A | N/A |
| 10 | 10 | 9 | N/A | 7 | N/A | 8 |

Note
to NiPt etch rating: 1 = no NiPt removed; 10 = all of the NiPt was removed
Note
to NiPtSi oxidization rating for SEM Pads: 1 = worst NiPtSi pads appearance in SEMs; 10 = best NiPtSi pads appearance in SEMs
Note
to NiPtSi oxidization rating for ESCA: 1 = worst NiPtSi Oxygen profile in ESCA; 10 = best NiPtSi Oxygen profile in ESCA Table 4 shows that, in comparative examples C1-C5 when no passivation step was used, although the etching step effectively removed the NiPt layer, it resulted in a level of oxidation in the NiPt silicide layer with substantial room for improvement. Using a passivation composition and passivation process of this disclosure to passivate the NiPt silicide layer prior to removing the NiPt layer by etching, enabled substantial decrease in oxidation levels for the NiPt silicide layer without significant negative effect on the NiPt etch rate (e.g., Example 6 in Table 4).

Optimization of the process conditions for the specific passivation and etch compositions employed can lead to superior results for a variety of device situations. Without wishing to be bound by theory, it is believed that longer times, higher temperature, and higher nitric acid concentrations (in this order) affect the degree of passivation through oxidation of the NiPt layer. These variables must be adjusted in combination with each other to prevent under- or over-passivation. While the etchant, the etchant temperature and etch time can be adjusted to compensate, the result can be a lower than desirable etch rate and/or a loss of selectivity between etching and oxidation of the NiPt silicide as the etching conditions must necessarily grow more aggressive to remove the passivation layer.

Al Compatibility Test

Examples 11-12 and Comparative Examples C15-C16

Typically, there is a thin (10-30 Å) native Aluminum oxide on the surface of Al coated substrate wafers. This native aluminum oxide was removed before testing the compatibility of passivation compositions by immersing the wafer into a 500 ml volume glass beaker containing approximately 200 ml of stirred 2 wt % $NH_4OH$ solution at room temperature. The wafer was held by plastic tweezers in the $NH_4OH$ solution in such a way that the side of the wafer with the Al layer faced the stir bar.

After the treatment period was completed, the wafer was quickly removed from the $NH_4OH$ solution and placed under direct DI water flow (2 L/min) perpendicular to the coupon surface at ambient DI water temperature (20-26° C.) for 50-80 seconds. The coupon was then immediately exposed to a nitrogen gas stream from a hand held nitrogen blowing gun which caused any droplets on the coupon surface to be blown off the coupon, and further completely dried the coupon device surface.

The Al coated substrates were passivated using the procedure described in General Procedure 3 under the conditions described in Table 5 within 10 minutes of the completion of the $NH_4OH$ treatment.

The Al etching rate is calculated by the difference in Al thickness before and after the passivation solution treatment divided by process time. The before and after thicknesses of Al were measured by using a 4-point probe, CDE Resmap 273.

TABLE 5

Aluminum Compatibility of Passivation Compositions

| Example # | Solution | Passivation Temp [C.] | Time [min] | Rinse/Dry | pure-Al etching rate [A/min] at 50 C./5 min |
|---|---|---|---|---|---|
| C15 | CPC1 | 50 | 5 | DIW/$N_2$ dry | 101 |
| C16 | CPC3 | 50 | 5 | DIW/$N_2$ dry | 210 |

TABLE 5-continued

Aluminum Compatibility of Passivation Compositions

| Example # | Passivation | | | | pure-Al etching rate [A/min] at 50 C./5 min |
|---|---|---|---|---|---|
| | Solution | Temp [C.] | Time [min] | Rinse/Dry | |
| 11 | PC1 | 50 | 5 | DIW/$N_2$ dry | 11.4 |
| 12 | PC2 | 50 | 5 | DIW/$N_2$ dry | 10.9 |

As illustrated in Table 5, the dilute nitric acid formulations are not compatible with Al wiring that may be present during the passivation of NiPtSi coatings.

Examples 13-19

Examples 13-19 are performed as described in General Procedure 3 according to the conditions described in Table 7. Analyses of results from these experiments are performed according to General Procedures 5. Passivation formulations (shown in Table 6) are prepared using General Procedure 1. The formulations are expected to passivate the NiPt/NiPt silicide coated substrate so that when etched, the remaining NiPt silicide has a low degree of oxidation.

TABLE 6

PASSIVATION COMPOSITIONS

| | Oxidizer (1)/ Amount [g] | Sulfonic acid (1)/Amount [g] | Sulfonic acid (2)/Amount [g] | Water Added [g] | Total Water from all sources (g) |
|---|---|---|---|---|---|
| PC5 | $HNO_3$/14.29 | ESA/173.60 | PTSA/12.103 | | 60.36 |
| PC6 | $HNO_3$/14.29 | MSA/173.60 | BSA/9.00 | 3.11 | 60.397 |
| PC7 | $HNO_3$/7.143 $TMANO_3$/15.434 | ESA/177.423 | | | 60 |
| PC8 | $HNO_3$/7.143 | MSA/173.60 | TFMSA/16 | 3.257 | 57.48 |
| PC9 | $HNO_3$/7.143 | BSA/140.00 | | 52.857 | 69.319 |
| PC10 | $HNO_3$/14.29 | MSA/173.60 | NSA/12.11 | | 60 |
| PC11 | $TMANO_3$/30.868 | MSA/169.132 | | | 60 |

Notes:
Nitric acid ($HNO_3$) is added as a 70% nitric acid solution in water;
$TMANO_3$ is added as a 70% tetramethylammonium nitrate solution in water;
ESA is added as a 70% ethanesulfonic acid solution in water;
MSA is added as a 70% methanesulfonic acid solution in water;
PTSA is added as a 67% p-toluenesulfonic acid solution in water;
BSA is added as a benzenesulfonic acid monohydrate solid;
TFMSA is added as a neat liquid containing trifluoromethanesulfonic acid;
NSA is added as a 70% solution of 1-naphthlalene sulfonic acid solution in water.

While the present disclosure has been described herein with reference to the specific embodiments thereof, it will be appreciated that changes, modification and variations can be made without departing form the spirit and scope of the inventive concept disclosed herein. Accordingly, it is intended to embrace all such changes, modification and variations that fall within the spirit and scope of the appended claims.

What is claimed is:

1. A passivation composition, comprising:
   from about 55% by weight to about 75% by weight of at least one sulfonic acid;
   at least one compound containing a nitrate or nitrosyl ion; and
   water;
   wherein the composition comprises from about 0.1% by weight to about 20% by weight of the nitrate or nitrosyl ion and is free of a halide ion.

2. The composition of claim 1, wherein the composition has a pH at most about 2.

3. The composition of claim 1, wherein the composition comprises from about 0.5% by weight to about 10% by weight of the nitrate or nitrosyl ion.

4. The composition of claim 1, wherein the at least one compound containing a nitrate or nitrosyl ion comprises nitric acid.

TABLE 7

Passivation and Etch Process Examples

| Example # | Passivation | | | | Etching | | | |
|---|---|---|---|---|---|---|---|---|
| | Solution | Temp [C.] | Time [min] | Rinse/Dry | Solution | Temp [C.] | Time [min] | Rinse/Dry |
| 13 | PC5 | 50 | 3 | DIW/$N_2$ dry | EC1 | 50 | 2 | DIW/$N_2$ dry |
| 14 | PC6 | 45 | 5 | DIW/$N_2$ dry | EC6 | 50 | 1 | DIW/$N_2$ dry |
| 15 | PC7 | 45 | 5 | DIW/$N_2$ dry | EC6 | 50 | 1 | DIW/$N_2$ dry |
| 16 | PC8 | 60 | 0.5 | DIW/$N_2$ dry | EC5 | 50 | 1 | DIW/$N_2$ dry |
| 17 | PC9 | 50 | 5 | DIW/$N_2$ dry | EC3 | 50 | 1 | DIW/$N_2$ dry |
| 18 | PC10 | 50 | 3 | DIW/$N_2$ dry | EC3 | 60 | 1 | DIW/$N_2$ dry |
| 19 | PC11 | 45 | 5 | DIW/$N_2$ dry | EC5 | 50 | 2 | DIW/$N_2$ dry |

5. The composition of claim 1, wherein the composition comprises a first sulfonic acid and a second sulfonic acid.

6. The composition of claim 5, wherein the first sulfonic acid is a compound of formula (1):

$$R^1SO_3H \quad (1),$$

in which $R^1$ is unsubstituted $C_1$-$C_4$ straight or branched alkyl.

7. The composition of claim 6, wherein the first sulfonic acid is methanesulfonic acid.

8. The composition of claim 5, wherein the second sulfonic acid comprises a compound of formula (2):

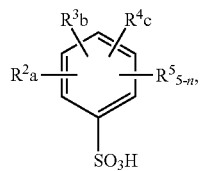

(2)

in which
each of $R^2$, $R^3$, and $R^4$, independently, is $C_1$-$C_{12}$ straight or branched alkyl, $C_3$-$C_{12}$ cyclic alkyl, F, Cl, or Br;
$R^5$ is H; and
each of a, b, c, and n, independently, is 0, 1, 2, or 3 provided that the sum of a, b, and c is n.

9. The composition of claim 8, wherein the second sulfonic acid is p-toluenesulfonic acid.

10. The composition of claim 1, wherein the composition consists essentially of the at least one sulfonic acid, the at least one compound containing a nitrate or nitrosyl ion; and the water.

11. A passivation composition, comprising:
a first sulfonic acid of formula (1):

$$R^1SO_3H \quad (1),$$

in which $R^1$ is unsubstituted $C_1$-$C_4$ straight or branched alkyl;
a second sulfonic acid of formula (2):

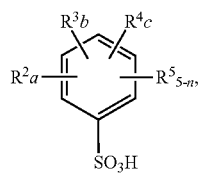

(2)

in which each of $R^2$, $R^3$, and $R^4$, independently, is $C_1$-$C_{12}$ straight or branched alkyl, $C_3$-$C_{12}$ cyclic alkyl, F, Cl, or Br; $R^5$ is H; and each of a, b, c, and n, independently, is 0, 1, 2, or 3 provided that the sum of a, b, and c is n;
at least one compound containing a nitrate or nitrosyl ion; and
water;
wherein the composition is free of a halide ion and the composition comprises from about 0.1% by weight to about 20% by weight of the nitrate or nitrosyl ion.

12. The composition of claim 11, wherein the composition has a pH at most about 2.

13. The composition of claim 11, wherein the composition comprises from about 0.5% by weight to about 10% by weight of the nitrate or nitrosyl ion.

14. The composition of claim 11, wherein the at least one compound containing a nitrate or nitrosyl ion comprises nitric acid.

15. The composition of claim 11, wherein the first sulfonic acid is methanesulfonic acid.

16. The composition of claim 11, wherein the second sulfonic acid is p-toluenesulfonic acid.

17. The composition of claim 11, wherein the first and second sulfonic acids are from about 55% by weight to about 90% by weight of the composition.

18. The composition of claim 11, wherein the composition consists essentially of the first and second sulfonic acids, the at least one compound containing a nitrate or nitrosyl ion, and the water.

19. A passivation composition, comprising:
a first sulfonic acid of formula (1):

$$R^1SO_3H \quad (1),$$

in which $R^1$ is unsubstituted $C_1$-$C_4$ straight or branched alkyl;
a second sulfonic acid of formula (2):

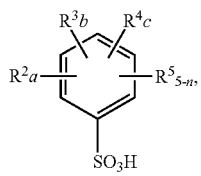

(2)

in which each of $R^2$, $R^3$, and $R^4$, independently, is $C_1$-$C_{12}$ straight or branched alkyl, $C_3$-$C_{12}$ cyclic alkyl, F, Cl, or Br; $R^5$ is H; and each of a, b, c, and n, independently, is 0, 1, 2, or 3 provided that the sum of a, b, and c is n;
at least one compound containing a nitrate or nitrosyl ion; and
water;
wherein the composition is free of a halide ion and the first and second sulfonic acids are from about 55% by weight to about 90% by weight of the composition.

20. The composition of claim 19, wherein the composition has a pH at most about 2.

21. The composition of claim 19, wherein the composition comprises from about 0.5% by weight to about 10% by weight of the nitrate or nitrosyl ion.

22. The composition of claim 19, wherein the at least one compound containing a nitrate or nitrosyl ion comprises nitric acid.

23. The composition of claim 19, wherein the first sulfonic acid is methanesulfonic acid.

24. The composition of claim 19, wherein the second sulfonic acid is p-toluenesulfonic acid.

25. The composition of claim 19, wherein the composition consists essentially of the first and second sulfonic acids, the at least one compound containing a nitrate or nitrosyl ion, and the water.

* * * * *